(12) United States Patent
Kim et al.

(10) Patent No.: US 10,978,912 B2
(45) Date of Patent: Apr. 13, 2021

(54) ELECTRONIC DEVICE FOR WIRELESSLY RECEIVING POWER AND OPERATION METHOD THEREOF

(71) Applicant: Samsung Electronics Co., Ltd., Gyeonggi-do (KR)

(72) Inventors: Young-Joon Kim, Gyeonggi-do (KR); Sang-Wook Lee, Gyeonggi-do (KR); Ki-Young Kim, Gyeonggi-do (KR); Dae-Hyun Kim, Incheon (KR); Ji-Hoon Jung, Seoul (KR)

(73) Assignee: Samsung Electronics Co., Ltd

( * ) Notice: Subject to any disclaimer, the term of this patent is extended or adjusted under 35 U.S.C. 154(b) by 40 days.

(21) Appl. No.: 15/951,887

(22) Filed: Apr. 12, 2018

(65) Prior Publication Data

US 2018/0301941 A1  Oct. 18, 2018

Related U.S. Application Data

(60) Provisional application No. 62/484,473, filed on Apr. 12, 2017.

(30) Foreign Application Priority Data

Jun. 27, 2017  (KR) .................. 10-2017-0081282

(51) Int. Cl.
*H02J 50/12* (2016.01)
*G05F 1/66* (2006.01)
(Continued)

(52) U.S. Cl.
CPC .............. *H02J 50/12* (2016.02); *G01R 21/06* (2013.01); *G05F 1/66* (2013.01); *H02J 50/10* (2016.02); *H02J 50/20* (2016.02)

(58) Field of Classification Search
CPC .. H02J 50/12; H02J 50/10; H02J 50/80; H02J 50/90; H04B 7/18506; H04W 48/00;
(Continued)

(56) References Cited

U.S. PATENT DOCUMENTS 8,265,617 B2 *  9/2012  Lazaridis .......... H04M 1/72533
                                              455/419
8,823,319 B2 *  9/2014  Von Novak, III ...... H02J 50/80
                                              320/108
(Continued)

FOREIGN PATENT DOCUMENTS

CN  102104285  6/2011
CN  103563212  2/2014
(Continued)

OTHER PUBLICATIONS

International Search Report dated Jul. 12, 2018 issued in counterpart application No. PCT/KR2018/004142, 8 pages.
(Continued)

*Primary Examiner* — Hal Kaplan
*Assistant Examiner* — Jagdeep S Dhillon
(74) *Attorney, Agent, or Firm* — The Farrell Law Firm, P.C.

(57) ABSTRACT

An electronic device and method for wirelessly receiving power are provided. The electronic device includes a wired power interface; a power receiving circuit; and a control circuit configured to control the power receiving circuit to wirelessly receive power from a wireless power transmitting device; and provide the received power to an external electronic device through the wired power interface.

33 Claims, 30 Drawing Sheets

(51) Int. Cl.
*G01R 21/06* (2006.01)
*H02J 50/20* (2016.01)
*H02J 50/10* (2016.01)

(58) Field of Classification Search
CPC ..... H04W 48/10; H04W 48/08; H04W 36/08; H04W 36/32; G05F 1/66
USPC .................. 307/104, 149, 66, 64, 9.1, 10.1
See application file for complete search history.

(56) References Cited

U.S. PATENT DOCUMENTS

| | | | |
|---|---|---|---|
| 10,381,878 B1* | 8/2019 | Grundmann | H01R 27/02 |
| 2004/0150934 A1* | 8/2004 | Baarman | H02J 50/40 |
| | | | 361/115 |
| 2007/0179231 A1* | 8/2007 | Sonobe | C08K 3/26 |
| | | | 524/318 |
| 2010/0078343 A1* | 4/2010 | Hoellwarth | B29C 45/14639 |
| | | | 206/320 |
| 2010/0109931 A1* | 5/2010 | Esnard | H04W 52/0235 |
| | | | 341/176 |
| 2010/0144284 A1* | 6/2010 | Chutorash | H04L 67/12 |
| | | | 455/66.1 |
| 2010/0161004 A1 | 6/2010 | Najafi | |
| 2011/0040996 A1 | 2/2011 | Hackbom et al. | |
| 2011/0248575 A1 | 10/2011 | Kim et al. | |
| 2012/0248886 A1 | 10/2012 | Kesler et al. | |
| 2012/0248887 A1 | 10/2012 | Kesler et al. | |
| 2013/0285603 A1 | 10/2013 | Zeinstra | |
| 2014/0156772 A1 | 6/2014 | Eaton | |
| 2014/0327409 A1* | 11/2014 | Lee | H02J 50/60 |
| | | | 320/137 |
| 2015/0008876 A1 | 1/2015 | Kwak et al. | |
| 2015/0194834 A1* | 7/2015 | Lee | H02J 7/00038 |
| | | | 320/107 |
| 2016/0001663 A1 | 1/2016 | Chae | |
| 2016/0013661 A1 | 1/2016 | Kurs et al. | |
| 2016/0043562 A1 | 2/2016 | Lisi | |
| 2016/0099576 A1 | 4/2016 | Ho | |
| 2016/0099609 A1 | 4/2016 | Leabman | |
| 2016/0099610 A1 | 4/2016 | Leabman | |
| 2016/0126779 A1* | 5/2016 | Park | H02J 50/80 |
| | | | 320/108 |
| 2016/0183009 A1* | 6/2016 | Kim | H04R 25/30 |
| | | | 381/315 |
| 2016/0286169 A1* | 9/2016 | Sannala | H01Q 1/24 |
| 2016/0352152 A1 | 12/2016 | Karalis et al. | |
| 2017/0012925 A1 | 1/2017 | Tekin et al. | |
| 2017/0012966 A1 | 1/2017 | De Foy et al. | |
| 2017/0013188 A1 | 1/2017 | Kothari | |
| 2017/0013228 A1 | 1/2017 | Kalendra et al. | |
| 2017/0063161 A1* | 3/2017 | Sugiyama | H02J 7/025 |
| 2017/0104368 A1 | 4/2017 | Radke | |
| 2017/0222484 A1 | 8/2017 | DeBaun | |
| 2017/0236638 A1 | 8/2017 | Mayo | |
| 2017/0237277 A1* | 8/2017 | Onishi | H02J 50/80 |
| | | | 307/23 |
| 2018/0247544 A1* | 8/2018 | Mustafic | G08G 5/0039 |
| 2018/0248613 A1* | 8/2018 | Peitzer | H04W 48/10 |
| 2018/0343150 A1* | 11/2018 | Vaughn | F24F 11/63 |
| 2019/0138469 A1* | 5/2019 | Lee | G06F 1/16 |

FOREIGN PATENT DOCUMENTS

| | | |
|---|---|---|
| JP | 2007149844 | 6/2007 |
| KR | 1020130050094 | 5/2013 |
| KR | 1020140017292 | 2/2014 |
| KR | 1020140121200 | 10/2014 |
| KR | 1020150004635 | 1/2015 |
| KR | 1020150105697 | 9/2015 |
| KR | 10-2015-0004635 | 12/2015 |
| KR | 1020150142216 | 12/2015 |
| KR | 1020170008438 | 1/2017 |
| KR | 1020170016147 | 2/2017 |
| WO | WO 2016/109327 | 7/2016 |

OTHER PUBLICATIONS

U.S. Office Action dated Oct. 7, 2019 issued in counterpart U.S Appl. No. 15/951,856, 30 pages.
U.S. Office Action dated Mar. 5, 2020 issued in counterpart U.S Appl. No. 15/951,856, 27 pages.
European Search Report dated Mar. 13, 2020 issued in counterpart application No. 18785165.4-1202, 8 pages.

* cited by examiner

ELECTRONIC DEVICE FOR WIRELESSLY RECEIVING POWER AND OPERATION METHOD THEREOF

CROSS-REFERENCE TO RELATED APPLICATION(S)

This application is based on and claims priority under 35 U.S.C. § 119 to U.S. Provisional Patent Application Ser. No. 62/484,473, which was filed in the U.S. Patent and Trademark Office on Apr. 12, 2017, and Korean Patent Application No. 10-2017-0081282, which was filed in the Korean Intellectual Property Office on Jun. 27, 2017, the disclosure of each of which is incorporated herein by reference in its entirety.

BACKGROUND

1. Field

The present disclosure relates generally to an electronic device for wirelessly receiving power and an operation method thereof.

2. Description of the Related Art

Portable digital communication devices are essential for many people in modern times. Consumers want various high-quality services to be provided anywhere and at any time. Recently, thanks to the Internet of things (IoT), various sensors, home appliances, and communication devices have been connected as a single network. However, in order to effectively operate the various sensors, a wireless power transmission system is needed.

Wireless power transmission may be conducted by a magnetic induction method, a magnetic resonance method, and an electromagnetic-wave method. The magnetic induction or magnetic resonance method is advantageous for charging an electronic device located relatively close to a wireless power transmitting device, but the electromagnetic-wave method is more advantageous for a long-distance power transmission, e.g., a several meters, than the magnetic induction or magnetic resonance method. The electromagnetic-wave method is mainly used for long-distance power transmission, and is able to detect a position of a power receiver in the distance, thereby transmitting power most efficiently.

As the efficiency of wireless power transmission/reception increases, relatively large capacity electronic devices, such as television (TV) sets, as well as small portable electronic devices, will be able to receive wirelessly power. If the electronic device includes a power receiving circuit for wirelessly receiving power, the price thereof, as well as the volume and weight of the electronic device, may increase. In addition, when the power receiving circuit is integrated within the electronic device, no other electronic device other may be wirelessly charged using the power receiving circuit.

SUMMARY

Accordingly, the present disclosure is made to address at least the problems and/or disadvantages described above and to provide at least the advantages described below.

An aspect of the present disclosure is to provide an electronic device that is detachably connected to an external electronic device.

Another aspect of the present disclosure is to provide an electronic device that can wirelessly receive power from a wireless power transmitting device and can provide the received power to an external electronic device.

In accordance with an embodiment, an electronic device is provided, which includes a wired power interface; a power receiving circuit; and a control circuit configured to control the power receiving circuit to wirelessly receive power from a wireless power transmitting device; and provide the received power to an external electronic device through the wired power interface.

In accordance with another embodiment, an operation method is provided for an electronic device. The operation method includes wirelessly receiving power from a wireless power transmitting device; and providing the received power to an external electronic device through a wired power interface of the electronic device.

In accordance with another embodiment, an electronic device is provided, which includes a power receiving circuit; a battery; and a control circuit configured to, if it is determined that a magnitude of power received through the power receiving circuit is greater than a predetermined magnitude, operate the electronic device using the received power; and if it is determined that the magnitude of the received power is less than or equal to the predetermined magnitude, operate the electronic device using the received power and power stored in the battery.

In accordance with another embodiment, an operation method is provided for an electronic device. The operation method includes wirelessly receiving power; in response to determining that a magnitude of the received power is greater than a predetermined magnitude, operating the electronic device using the received power; and in response to determining that the magnitude of the received power is less than or equal to the predetermined magnitude, operating the electronic device using the received power and a power stored in a battery of the electronic device.

In accordance with another embodiment, an electronic device is provided, which includes a wired power interface; a power receiving circuit; and a control circuit configured to, when connected to a first external electronic device through the wired power interface, control the power receiving circuit to receive first power having a first magnitude; control the wired power interface to provide the received first power to the first external electronic device; when disconnected from the first external electronic device and connected to a second external electronic device through the wired power interface, control the power receiving circuit to receive second power having a second magnitude different from the first magnitude through the power receiving circuit; and control the wired power interface to provide the received second power to the second external electronic device.

In accordance with another embodiment, an operation method is provided for an electronic device. The operation method includes when connected to a first external electronic device through a wired power interface, receiving first power having a first magnitude from a wireless power transmitting device; providing the received first power to the first external electronic device through the wired power interface; when disconnected from the first external electronic device and connected to a second external electronic device through the wired power interface, receiving, from the wireless power transmitting device, second power having a second magnitude different from the first magnitude;

and providing the received second power to the second external electronic device through the wired power interface.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
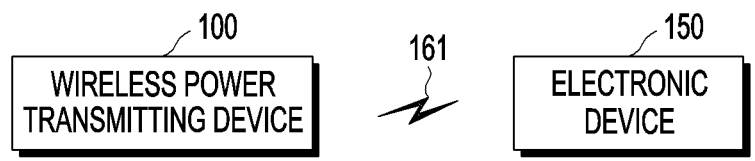
FIG. 1 illustrates a wireless power transmitting device and an electronic device according to an embodiment.

Hereinafter, various embodiments will be described with reference to the accompanying drawings. The embodiments and the terms used herein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. Singular forms may include plural forms as well unless the context clearly indicates otherwise.

The expression "a first", "a second", "the first", or "the second" may modify various components regardless of the order and/or the importance, but does not limit the corresponding components. When an element (e.g., a first element) is referred to as being "(functionally or communicatively) connected," or "directly coupled" to another element (e.g., a second element), the first element may be connected directly to the second element or indirectly connected to the second element through another element (e.g., a third element).

The expression "configured to" as used in various embodiments may be interchangeably used with, for example, "suitable for", "having the capacity to", "designed to", "adapted to", "made to", or "capable of" in terms of hardware or software, according to circumstances. Alternatively, in some situations, the expression "device configured to" may indicate that the device, together with other devices or components, "is able to". For example, the phrase "processor adapted (or configured) to perform A, B, and C" may indicate a dedicated processor (e.g., an embedded processor) only for performing the corresponding operations or a generic-purpose processor (e.g., a central processing unit (CPU) or an application processor (AP)) that can perform the corresponding operations by executing one or more software programs stored in a memory device.

A wireless power transmission device or an electronic device may include a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), an MPEG-1 audio layer-3 (MP3) player, a mobile medical device, a camera, and a wearable device. For example, the wearable device may include an accessory type device (e.g., a watch, a ring, a bracelet, an anklet, a necklace, a glasses, a contact lens, or a head-mounted device (HMD)), a fabric or clothing integrated type device (e.g., an electronic clothing), a body-mounted type device (e.g., a skin pad, or tattoo), and a bio-implantable type device (e.g., an implantable circuit). The wireless power transmission device or the electronic device may include at least one of a TV, a set-top box linked wiredly or wirelessly to a TV, a digital video disk (DVD) player, an audio device, a refrigerator, an air conditioner, a vacuum cleaner, an oven, a microwave oven, a washing machine, an air cleaner, a set-top box, a home automation control panel, a security control panel, a media box, a game console, an electronic dictionary, an electronic key, a camcorder, an electric vehicle, and an electronic photo frame.

The wireless power transmission device or the electronic device may also include a medical device (e.g., a portable medical measuring device, such as a blood glucose monitoring device, a heart rate monitoring device, a blood pressure measuring device, a body temperature measuring device, etc., a magnetic resonance angiography (MRA) device, a magnetic resonance imaging (MRI) device, a computed tomography (CT) machine, and an ultrasonic machine), a navigation device, a global positioning system (GPS) receiver, an event data recorder (EDR), a flight data recorder (FDR), a vehicle infotainment device, an electronic devices for a ship (e.g., a navigation device for a ship, and a gyro-compass), avionics, a security device, an automotive head unit, a robot for home or industry, an automatic teller machine (ATM), a point of sales (POS) device, or an IoT device (e.g., a light bulb, a sensor, an electric or gas meter, a sprinkler device, a fire alarm, a thermostat, a streetlamp, a toaster, a sporting goods, a hot water tank, a heater, a boiler, etc.).

The wireless power transmission device or the electronic device may include a part of furniture or a building/structure, an electronic board, an electronic signature receiving device, a projector, and/or a measuring instrument (e.g., a water meter, an electric meter, a gas meter, a radio wave meter, etc.).

The wireless power transmission device or the electronic device may be flexible, or may be a combination of one or more of the aforementioned various devices.

However, the wireless power transmission device or the electronic device is not limited to the above described devices.

In the present disclosure, the term "user" may indicate a person using an electronic device or a device (e.g., an artificial intelligence electronic device) using a wireless power transmission device or an electronic device.

FIG. 1 illustrates a wireless power transmitting device and an electronic device according to an embodiment.

Referring to FIG. 1, the wireless power transmitting device 100 may wirelessly transmit power 161 to an electronic device 150 according to various charging methods. For example, the wireless power transmitting device 100 may transmit the power 161 by an induction method, wherein the wireless power transmitting device 100 includes a power source, a direct current (DC)-to-alternating current (AC) converting circuit, an amplifying circuit, an impedance matching circuit, one or more capacitors, one or more coils, a communication modulation/demodulation circuit, etc. The one or more capacitors and the one or more coils may constitute a resonance circuit. The wireless power transmitting device 100 may be implemented by the method defined in the wireless power consortium (WPC) standard (or the Qi standard).

Alternatively, the wireless power transmitting device 100 may transmit the power 161 by a resonance method, wherein the wireless power transmitting device 100 includes a power source, a DC-to-AC converting circuit, an amplifying circuit, an impedance matching circuit, one or more capacitors, one or more coils, an out-band communication circuit (e.g., a Bluetooth low energy (BLE) communication circuit), etc. The one or more capacitors and the one or more coils may constitute a resonance circuit. The wireless power transmitting device 100 may be implemented by a method defined in the Alliance for Wireless Power (A4WP) standard or the air fuel alliance (AFA) standard.

The wireless power transmitting device 100 may include a coil capable of generating an induced magnetic field when a current flows therethrough by a resonance method or by an induction method. The process in which the wireless power transmitting device 100 generates an induced magnetic field may be expressed as the wireless power transmitting device 100 wirelessly transmits the power 161. In addition, the electronic device 150 may include a coil that generates an induced electromotive force using a magnetic field formed around the coil and whose magnitude varies with time. The process in which the electronic device 150 generates an induced electromotive force through a coil may be expressed that the electronic device 150 wirelessly receives the power 161.

As yet another alternative, the wireless power transmitting device 100 may transmit the power 161 by an electromagnetic-wave method, wherein the wireless power transmitting device 100 includes a power source, a DC-to-AC converting circuit, an amplifying circuit, a distributing circuit, a phase shifter, a power transmitting antenna array including a plurality of patch antennas, an out-band communication circuit (e.g., a BLE communication module), etc. The respective patch antennas may form radio frequency (RF) waves (e.g., electromagnetic waves). The electronic device 150 may include a patch antenna capable of outputting a current using an RF wave formed around the patch antenna. The wireless power transmitting device 100 may wirelessly transmit the power 161 through the process in which the wireless power transmitting device 100 forms an RF wave. The electronic device 150 may wirelessly receive the power 161 through the process in which the electronic device 150 outputs current from the patch antenna using an RF wave.

The wireless power transmitting device 100 may communicate with the electronic device 150, e.g., in an in-band manner. The wireless power transmitting device 100 or the electronic device 150, may change the load (or impedance) for data to be transmitted according to an on/off keying modulation scheme. The wireless power transmitting device 100 or the electronic device 150, based on a change in the magnitude of the current, voltage, or power of the coil, may measure a load change (or impedance change), thereby determining the data to be transmitted from a counterpart device.

Alternatively, the wireless power transmitting device 100 may communicate with the electronic device 150 in an out-band manner. The wireless power transmitting device 100 or the electronic device 150 may transmit and receive data using a communication circuit (e.g., a BLE communication module) provided separately from the coil or the patch antenna.

Herein, the execution of a specific operation by the wireless power transmitting device 100 or the electronic device 150 may indicate that various hardware components included in the wireless power transmitting device 100 or the electronic device 150, such as a control circuit (e.g., a processor), a coil, or a patch antenna, execute the specific operation. Alternatively, the execution of a specific operation by the wireless power transmitting device 100 or the electronic device 150 may indicate that a processor performs control such that another hardware component executes a specific operation. Alternatively, the execution of a specific operation by the wireless power transmitting device 100 or the electronic device 150 may indicate an operation that causes a processor or another hardware device to execute a specific operation by the execution of instructions for performing a specific operation, which are stored in a storage circuit (e.g., a memory) of the wireless power transmitting device 100 or the electronic device 150.

Figure 2A:
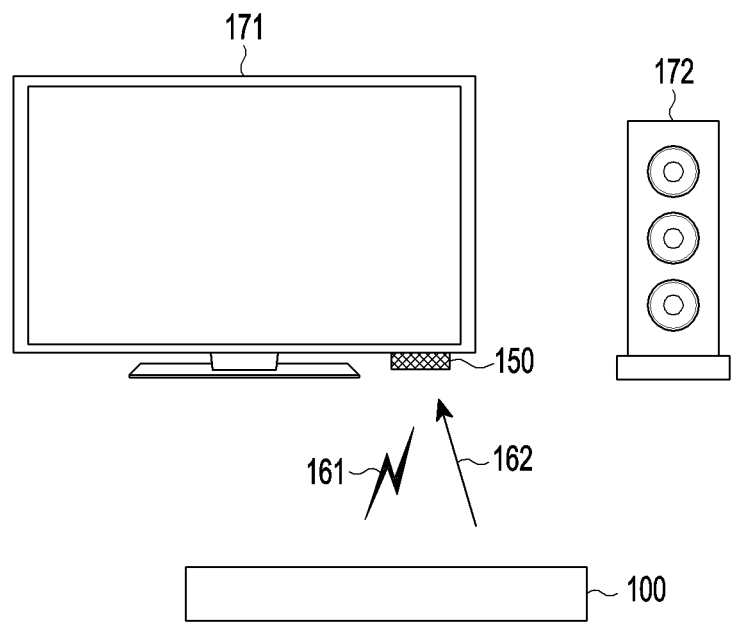
FIGS. 2A and 2B illustrate a wireless power transmitting device, an electronic device, and an external electronic device according to an embodiment.
Figure 2B:
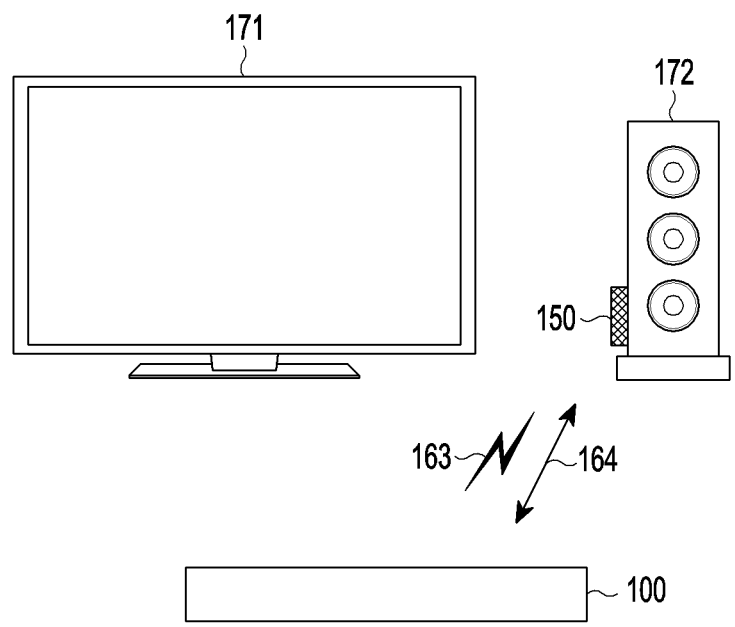

FIGS. 2A and 2B illustrate a wireless power transmitting device, an electronic device, and an external electronic device according to an embodiment.

Referring to FIG. 2A, an electronic device 150 may wirelessly receive power 161 from a wireless power transmitting device 100. The electronic device 150 may be electrically connected to a TV set 171, which is one type of an external electronic device. For example, the electronic device 150 may be electrically connected to a power supply interface of the TV set 171. The electronic device 150 may be connected to the power supply interface of the TV set 171 directly or through a cable. The electronic device 150 may include fastening means, such as a clip, by which the electronic device 150 can be fastened to at least a portion of the TV set 171. The electronic device 150 may process the wirelessly received power 161 to then provide the processed power to the TV set 171. For example, the electronic device 150, based on identification information, rated power information, and/or power consumption information of the TV set 171, may process the received power 161 to provide the processed power to the TV set 171.

When the TV set 171 does not include a circuit for wirelessly receiving power, the TV set 171 may receive power from the electronic device 150 for operation. Accordingly, even if the TV set 171 is not connected to a wall outlet through a power cable, the TV set 171 can still receive power for operation.

The electronic device 150 may receive a communication signal 162 from the wireless power transmitting device 100. The communication signal 162 may include at least one piece of wireless power transmission/reception-related information, TV control data, and/or media data.

The wireless power transmitting device 100 may be included in a set-top box that is able to wirelessly transmit the power 161 and media data to electronic device 150. Alternatively, the wireless power transmitting device 100 may be included in an integrated data transceiver that is able to transmit data from various electronic devices, such as a set-top box, a media device (e.g., a DVD player), or a game console, to the TV set 171. In this case, the wireless power transmitting device 100 may receive media data from various electronic devices through wireless or wired communication, and may transmit the received media data to the TV set 171 through wireless or wired communication. Alternatively, the wireless power transmitting device 100 may be included in a speaker.

The electronic device 150 may transmit the received media data to the TV set 171. For example, the electronic device 150 may be connected to a media data input interface of the TV set 171, directly or via a cable. The electronic device 150 may directly provide the received media data to the TV set 171, or the electronic device 150 may perform processes for the received media data, such as decoding or image correction, in order to provide the processed media data to the TV set 171. The TV set 171 may display, on a display, a screen that is rendered using the received media data. Media data, wireless charging control data, and TV control data may be transmitted and received by the same communication scheme, or may be transmitted and received by different communication schemes. For example, the wireless power transmitting device 100 may transmit media data to the electronic device 150 according to a communication scheme defined in the wireless gigabit alliance (Wi-gig), may transmit and receive wireless charging control data using a BLE module, and may transmit TV control data to the electronic device 150 using an IR module, but the present disclosure is not limited to a specific communication scheme.

The electronic device 150 may include an IR module for receiving a control signal from a control device, such as a remote controller, by an IR communication scheme, and may receive a control signal from a remote controller or the wireless power transmitting device 100.

At least two pieces of media data, wireless charging control data, and TV control data may be transmitted and received by a single communication module. For example, the wireless power transmitting device 100 may transmit media data to the electronic device 150 through the Wi-gig communication scheme, and may transmit wireless charging control data and TV control data through a BLE module. The electronic device 150 may wirelessly provide the TV set 171 with the power, which is wirelessly received.

When the TV set 171 includes a power receiving circuit for wirelessly receiving power, the electronic device 150 may wirelessly transmit power to the TV set 171. In this case, the electronic device 150 may operate as a repeater. The electronic device 150 may further include a power transmitting circuit capable of wirelessly transmitting power.

Referring to FIG. 2B, the electronic device 150 may be detached from the TV set 171, and may be connected to a speaker 172, which is another type of external electronic device. The electronic device 150 may be electrically connected to a power supply interface of the speaker 172. The electronic device 150 may be connected to the power supply interface of the speaker 172 directly or via a cable. A physical shape of the power interface of the TV set 171 may be the same as or different from that of the power interface of the speaker 172. The electronic device 150 may include a plurality of sockets having several shapes to enable connections with power interfaces having various shapes. The electronic device 150 may wirelessly receive power 163 from the wireless power transmitting device 100, and may provide the received power 163 to the speaker 172. The electronic device 150 may wirelessly receive media data 164 related to the sound from the wireless power transmitting device 100, and may provide the received media data to the speaker 172. The electronic device 150 may be connected, directly or via a cable, to a media data connection interface in relation to the sound of the speaker 172. The electronic device 150 may receive media data related to the sound from another electronic device, other than the set-top box.

Based on information related to the rated power of the speaker 172 or on the power consumption of the speaker 172, the electronic device 150 may process and provide the received power 163. The electronic device 150 may store various processing programs for processing a variety of data 162 and 164.

The electronic device 150 may obtain identification information or power consumption information of a connected external electronic device. The electronic device 150 may transmit the obtained identification information or power consumption information of the external electronic device to the wireless power transmitting device 100. The wireless power transmitting device 100, based on the received information, may adjust the magnitude of the power to be transmitted.

Alternatively, based on the obtained identification information or power consumption information of the external electronic device, the electronic device 150 may directly determine the magnitude of the transmission power. The electronic device 150 may transmit information on the determined magnitude of the transmission power to the wireless power transmitting device 100, and the wireless power transmitting device 100, based on the received information, may adjust the magnitude of the transmission power.

Accordingly, the magnitude of the power 161 received by the electronic device 150, when the electronic device 150 is connected to the TV set 171 having a relatively large power consumption value, may be greater than the magnitude of the power 163 received by the electronic device 150, when the electronic device 150 is connected to the speaker 172 having a relatively small power consumption value.

Figure 3A:
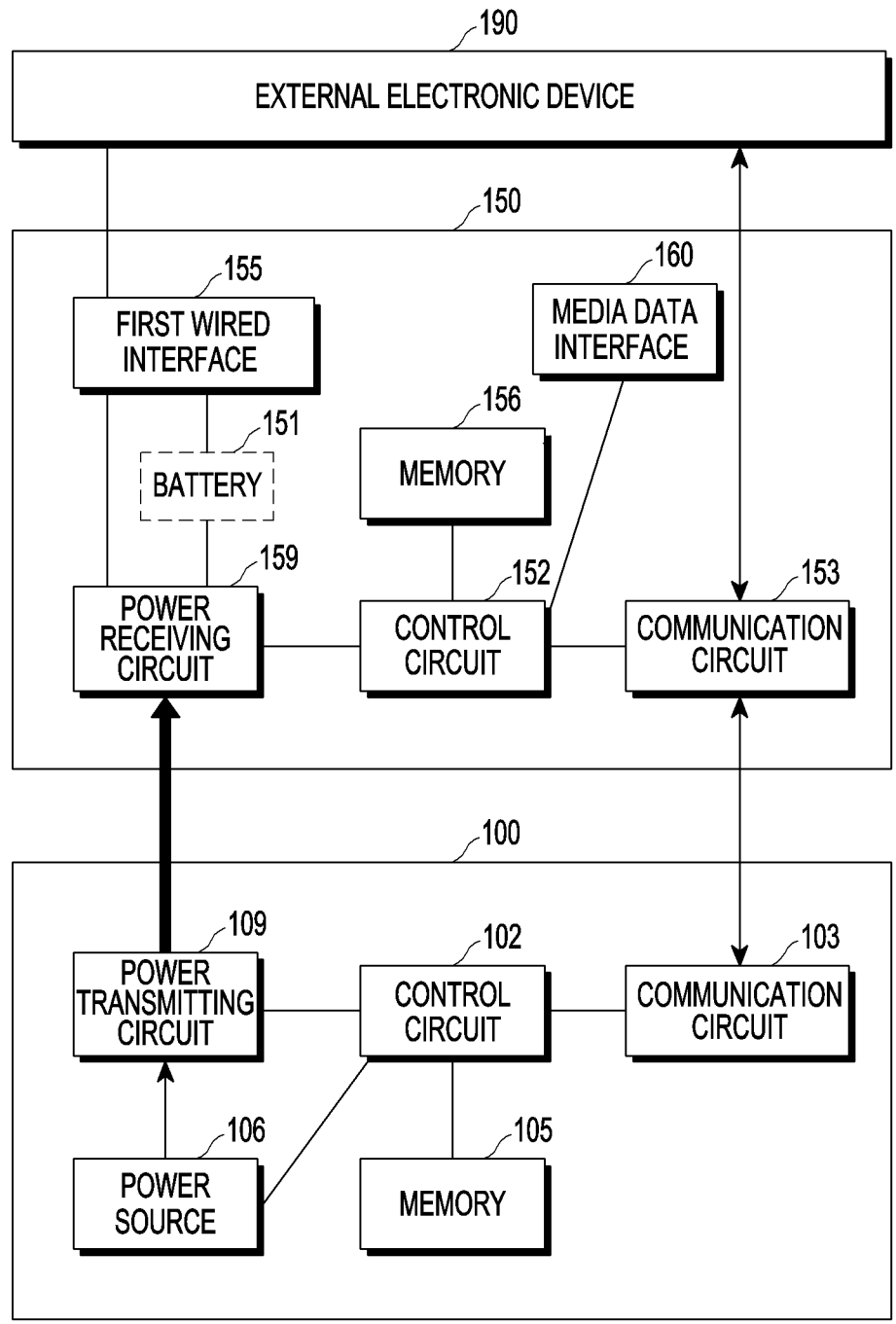
FIG. 3A illustrates an electronic device, a wireless power transmitting device, and an external electronic device according to an embodiment.

FIG. 3A illustrates an electronic device, a wireless power transmitting device, and an external electronic device according to various embodiments.

Referring to FIG. 3A, the wireless power transmitting device 100 includes a power transmitting circuit 109, a control circuit 102, a communication circuit 103, a memory 105, and a power source 106. The electronic device 150 includes a power receiving circuit 159, a control circuit 152, a communication circuit 153, a first wired interface 155, a memory 156, and a media data interface 160. The electronic device 150 may also include a battery 151. Alternatively, the electronic device 150 may exclude the battery 151 and/or the media data interface 160.

The power transmitting circuit 109 may wirelessly transmit power by at least one of an induction method, a resonance method, and an electromagnetic-wave method. The configurations of the power transmitting circuit 109 and the power receiving circuit 159 will be described in more detail with reference to FIGS. 3C and 3D.

The control circuit 102 may control the magnitude of the power transmitted by the power transmitting circuit 109. For example, the control circuit 102 may control the magnitude of the power transmitted by the power transmitting circuit 109 by controlling the magnitude of the power output from the power source 106 or by controlling the amplification gain of a power amplifier included in the power transmitting circuit 109. The control circuit 102 may adjust the magnitude of the power output from the power source 106 by controlling the duty cycle or frequency of the power output from the power source 106. The control circuit 102 may control the magnitude of the power applied to the power transmitting circuit 109 by controlling the magnitude of a bias voltage of the power amplifier. The control circuit 102 or the control circuit 152 may be implemented by various circuits capable of performing operations, such as a common processor (e.g., a CPU), a mini-computer, a microprocessor, a micro-controlling unit (MCU), a field programmable gate array (FPGA), etc., but is not limited to a specific type.

The control circuit 102 may receive, from the electronic device 150, identification information of the external electronic device 190, power consumption information of the external electronic device 190, and/or information on the magnitude of the transmission power thereof through the communication circuit 103. The control circuit 102, based on the received information, may control the magnitude of the power transmitted through the power transmitting circuit 109.

Accordingly, when an external electronic device 190 having a relatively large power consumption value is connected to the electronic device 150, the control circuit 102 may set the magnitude of the transmission power to be relatively large. The control circuit 152 may obtain identification information of the external electronic device 190 through wireless communication with the connected external electronic device 190.

Alternatively, based on the magnitude of at least one of the voltage, the current, or the power applied to the first wired interface 155, the control circuit 152 may obtain power consumption information of the external electronic device 190. The control circuit 152 may control the communication circuit 153 to transmit obtained the information to the wireless power transmitting device 100. Alternatively, the control circuit 152, based on the obtained information, may directly determine the magnitude of the power to be transmitted by the wireless power transmitting electronic device 100, and may control the communication circuit 153 to transmit information on the magnitude of the transmission power to the wireless power transmitting device 100.

The control circuit 102 may receive information on the state of the external electronic device 190 through the communication circuit 103. The information on the state may include information related to the power consumption of the external electronic device 190, e.g., information on the display brightness, light and shade, contrast, volume, etc., in the case of a TV set.

The control circuit 102, based on information on the state of the external electronic device 190, may determine the magnitude of the transmission power. The control circuit 102 may control the communication circuit 103 to transmit media data to the electronic device 150. The control circuit 102 may receive media data from other electronic devices (e.g., a set-top box, a game console, a DVD player, etc.) through the media data interface 160. The media data interface 160 may be connected to other electronic devices by a wire, and may receive media data through wired communication. Alternatively, the media data interface 160 may wirelessly receive media data from other electronic devices.

The wireless power transmitting device 100 may also include a media data interface. For example, the wireless power transmitting device 100 may receive media data from other electronic devices through the media data interface by wired or wireless communication. When the wireless power transmitting device 100 supports only a function of wirelessly transmitting power, the media interface may be omitted from the wireless power transmitting device 100.

The wireless power transmitting device 100 may receive, through the media data interface, media data from any one of a plurality of external electronic devices according to an external input. The control circuit 102 may control the communication circuit 103 to transmit the received media data to the electronic device 150. The control circuit 102 may analyze the media data to thus determine the magnitude of the power to be transmitted. For example, when the media data includes a plurality of encoded image frames, the control circuit 102 may determine coefficients corresponding to respective DC components of the plurality of encoded image frames. The control circuit 102 may determine coefficients corresponding to the DC components before transforming the plurality of encoded image frames. The magnitudes of the coefficients corresponding to the DC components of the plurality of encoded image frames may be related to the overall brightness of the image frames after decoding. Accordingly, the control circuit 102 may determine the brightness information of the respective image frames by determining the magnitudes of the coefficients corresponding to the DC components, even before decoding the encoded image frames. The control circuit 102 may determine the magnitude of the transmission power to correspond to the brightness information.

The power receiving circuit 159 may wirelessly receive power from the power transmitting circuit 109 by at least one of an induction method, a resonance method, and an electromagnetic-wave method. The power receiving circuit 159 may process the received power by rectifying an AC waveform of the power into a DC waveform, converting the voltage thereof, or regulating the power. The first wired interface 155 may be connected to a power supply interface of the external electronic device 190, directly or via a cable. When the power supply interface of the external electronic device 190 has, e.g., a physical shape of a 220V-plug, the first wired interface 155 may have a shape of a 220V-socket. The first wired interface 155 may transmit the power output from the power receiving circuit 159 to the external electronic device 190.

The power receiving circuit 159 may process the wirelessly received power in order to provide the processed power to the external electronic device 190, or may directly provide the wirelessly received power to the external electronic device 190 without first processing the power.

When the battery 151 is included in the electronic device 150, at least some of the power output from the power receiving circuit 159 may be used to charge the battery 151. The electronic device 190 may charge the battery 151 using the converted power, or may provide power to a charger for charging the battery 151 in order to control the charger to charge the battery 151. The battery 151 may provide operation power when no electronic device 150 wirelessly receives power, or may provide power to the external electronic device 190. The electronic device 150 may provide the wirelessly received power to the external electronic device 190, may provide the power of the battery 151 to the external electronic device 190, or may provide both the wirelessly received power and the power of the battery 151 to the external electronic device 190.

The control circuit 152 may control the overall operation of the electronic device 150. The memory 156 may store instructions for performing the overall operation of the electronic device 150, or the memory 156 may store a lookup table for a relationship between the obtained information and the magnitude of the power to be transmitted, a lookup table for a relationship between the obtained information and the magnitude of the power to be received, equation information on a relationship between the obtained information and the magnitude of the power to be transmitted, equation information on a relationship between the obtained information and the magnitude of the power to be received, etc.

The memory 105 may store instructions for performing the overall operation of the wireless power transmitting device 100, or the memory 105 may store a lookup table for a relationship between information obtained through the communication circuit 103 and the magnitude of the power to be transmitted, equation information on a relationship between the obtained information and the magnitude of the power to be transmitted, etc.

The memory 105 or the memory 156 may be implemented in various forms, such as a read-only memory (ROM), a random access memory (RAM), a flash memory, etc.

Figure 3B:
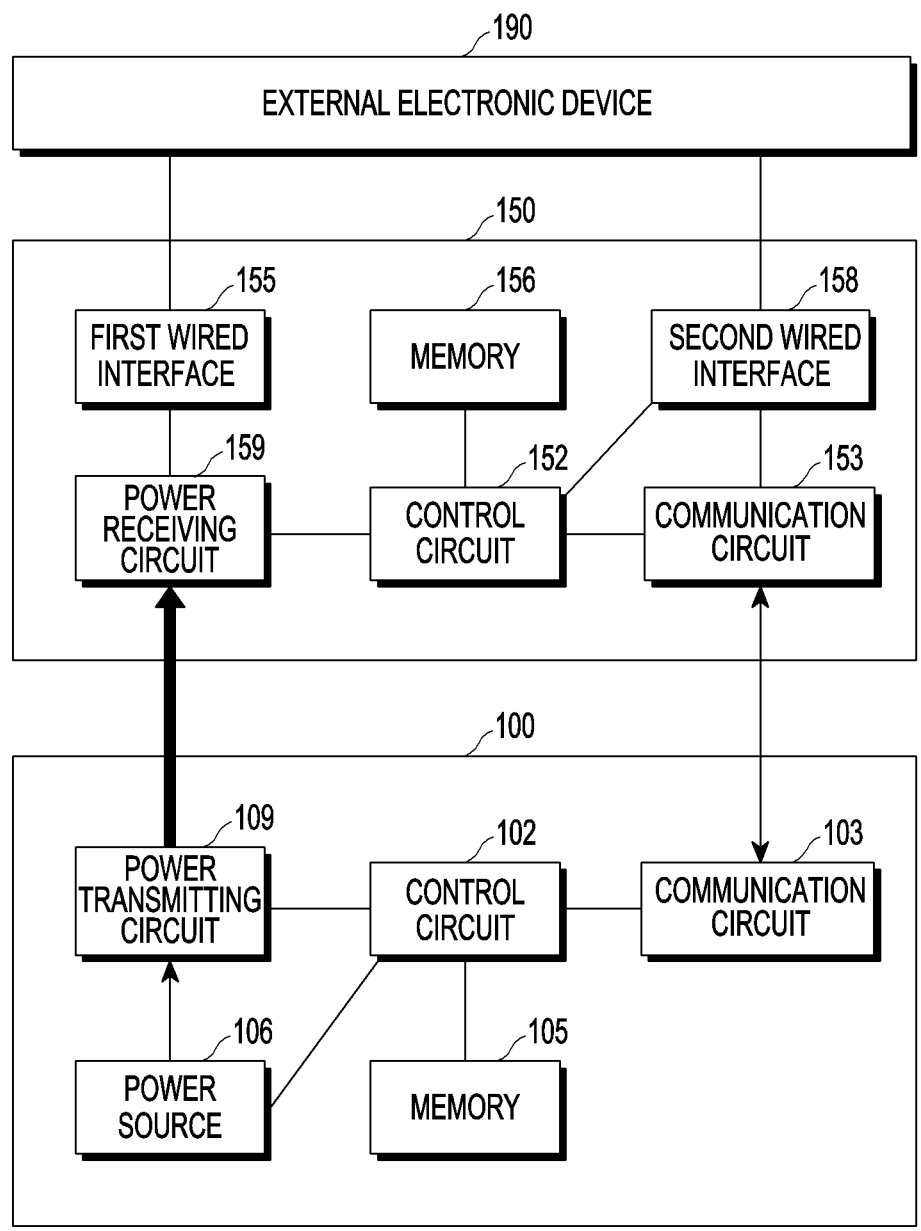
FIG. 3B illustrates an electronic device, a wireless power transmitting device, and an external electronic device according to an embodiment.

FIG. 3B illustrates an electronic device, a wireless power transmitting device, and an external electronic device according to an embodiment.

Referring to FIG. 3B, compared to FIG. 3A, the electronic device 150 includes a second wired interface 158. The second wired interface 158 may be connected to a media data input interface of the external electronic device 190, directly or via a cable. For example, when the external electronic device 190 includes a terminal of a high-definition multimedia interface (HDMI), the second wired interface 158 may be implemented as an HDMI terminal connection plug.

The electronic device 150 may receive media data from the wireless power transmitting device 100 through a communication circuit 153. The communication circuit 153 may transmit and receive communication signals for wireless power transmission/reception control. For example, the A4WP standard proposes that a power receiving unit (PRU) includes an out-band BLE communication circuit, and the electronic device 150 may include a BLE communication circuit. The electronic device 150 may transmit and receive media data and communication signals for wireless power transmission/reception control through one communication circuit. Alternatively, the electronic device 150 may receive media data through one communication circuit, and may transmit and receive communication signals for wireless power transmission/reception control through another communication circuit.

The external electronic device 190 may reproduce the media data received through the second wired interface 158. The electronic device 150 may transmit both power and media data through a single cable. For example, the electronic device 150 may provide power and media data to the external electronic device 190 through a single cable by performing modulation for the power to be provided.

Figure 3C:
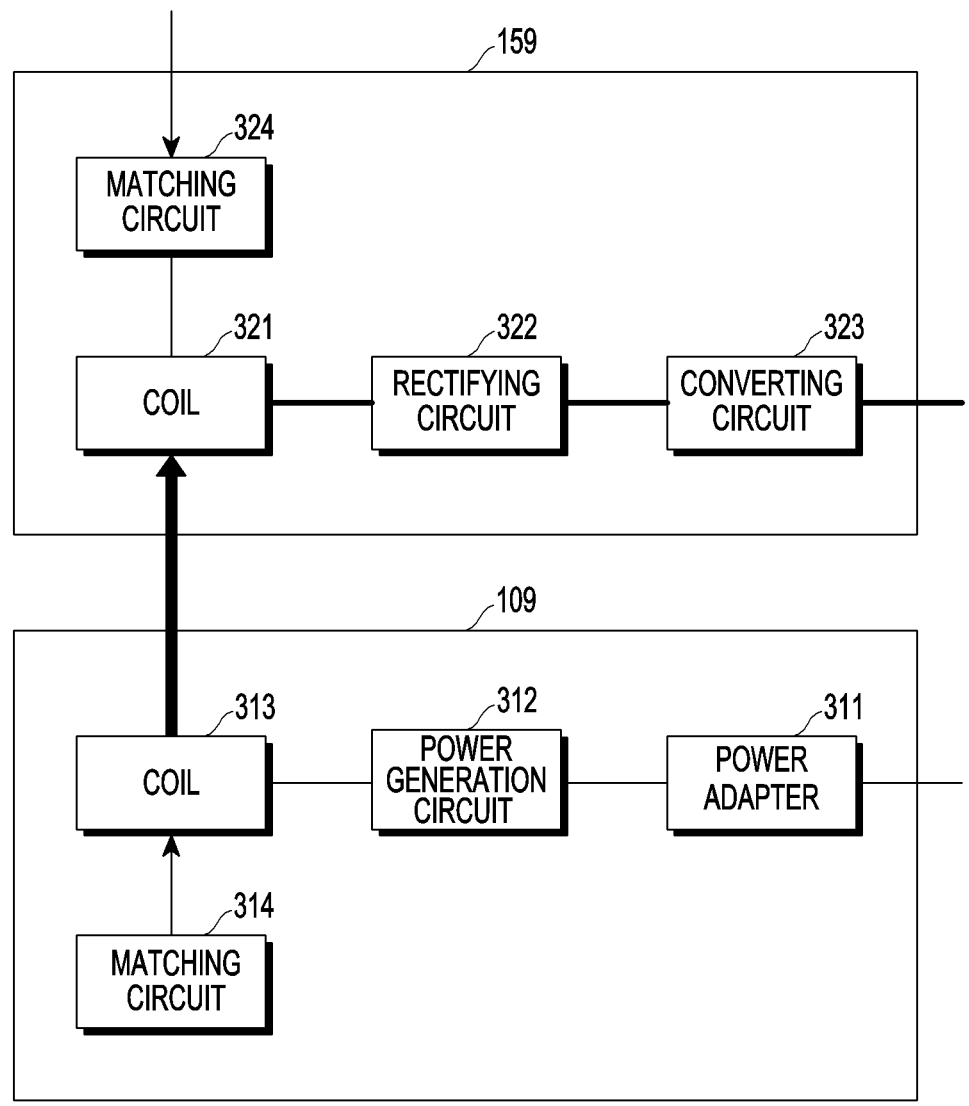
FIG. 3C illustrates a power transmitting circuit and a power receiving circuit in an induction or resonance method according to an embodiment.

FIG. 3C illustrates a power transmitting circuit and a power receiving circuit in an induction or resonance method according to an embodiment.

Referring to FIG. 3C, the power transmitting circuit 109 includes a power adapter 311, a power generation circuit 312, a coil 313, and a matching circuit 314. The power adapter 311 may receive power from the power source 106 and provide the received power to the power generation circuit 312. The power generation circuit 312 may convert the received power into an AC waveform, or may amplify the received power in order to transfer the received power to the coil 313. The frequency of the AC waveform may be set to 100 to 205 kHz, 6.78 MHz, etc., according to the standard, but it is not limited thereto.

When power is applied to the coil 313, an induced magnetic field whose magnitude changes with time may be formed from the coil 313, so that power may be transmitted wirelessly.

Although not illustrated in FIG. 3C, capacitors constituting a resonance circuit together with the coil 313 may be further included in the power transmitting circuit 109.

The matching circuit 314 may change at least one of the capacitance or the reactance of the circuit connected to the coil 313 under the control of the control circuit 102 in order to perform impedance matching between the power transmitting circuit 109 and the power receiving circuit 159. An induced electromotive force may be generated in the coil 321 of the power receiving circuit 159 by using a magnetic field formed around the coil 321 and whose magnitude varies with time, so that the power receiving circuit 159 may wirelessly receive power.

A rectifying circuit 322 may rectify the received power of an AC waveform. A converting circuit 323 may adjust a voltage of the rectified power, and may transmit the adjusted power to a power management integrated circuit (PMIC).

The power receiving circuit 159 may further include a regulator, or the converting circuit 323 may be replaced with a regulator. The matching circuit 324 may change at least one of the capacitance or the reactance of the circuit connected to the coil 321 under the control of the control circuit 152 in order to perform impedance matching between the power transmitting circuit 109 and the power receiving circuit 159.

In FIG. 3C, the electronic device 150 may convert the wirelessly received AC power into DC power in order to provide the DC power to the external electronic device 190. Alternatively, the electronic device 150 may convert the received power into AC power available in the country in which the electronic device 150 is used, and may provide the converted power to the external electronic device 190. In this case, the power receiving circuit 159 may change at least one of the amplitude or the frequency of the wirelessly received AC power, and may provide the changed power to the external electronic device 190 through the first wired interface 155.

The power receiving circuit 159 may include a circuit for changing at least one of the amplitude or the frequency of the AC power. Alternatively, the power receiving circuit 159 may include both a circuit for converting the AC power into DC power and a circuit for converting the characteristics (at least one of the amplitude or the frequency) of the AC power.

Figure 3D:
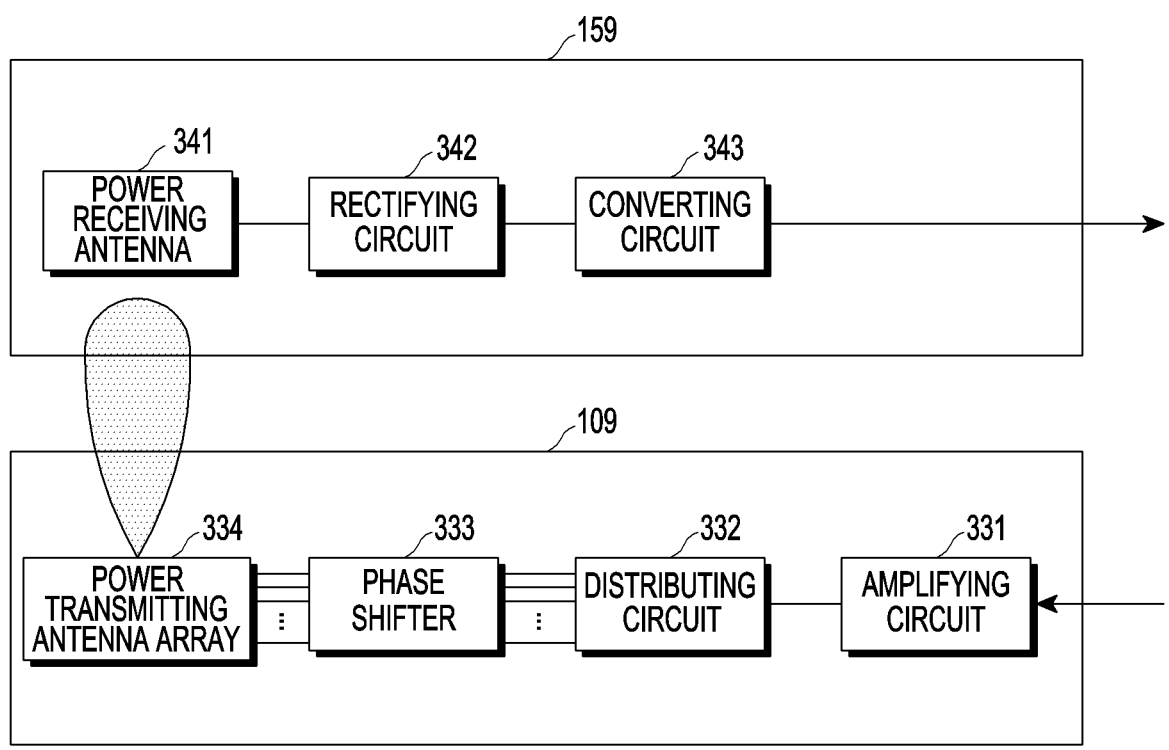
FIG. 3D illustrates a power transmitting circuit and a power receiving circuit in an electromagnetic-wave method according to an embodiment.

FIG. 3D illustrates a power transmitting circuit and a power receiving circuit in an electromagnetic-wave method according to an embodiment.

Referring to FIG. 3D, the power transmitting circuit 109 includes an amplifying circuit 331, a distributing circuit 332, a phase shifter 333, and a power transmitting antenna array 334. The power receiving circuit 159 includes a power receiving antenna 341, a rectifying circuit 342, and a converting circuit 343.

The amplifying circuit 331 may amplify power supplied from the power source 106 in order to provide the amplified power to the distributing circuit 332. The amplifying circuit 331 may be implemented by a variety of amplifiers, such as a drive amplifier (DA), a high power amplifier (HPA), a gain block amplifier (GBA), or a combination thereof, but is not limited thereto.

The distributing circuit 332 may distribute the power output from the amplifying circuit 331 to a plurality of paths. Any circuit capable of distributing input power or signals to a plurality of paths may be adopted as the distributing circuit 332. For example, the distributing circuit 332 may distribute the power to the paths corresponding to the number of patch antennas included in the power transmitting antenna array 334.

The phase shifter 333 may shift the respective phases (or delays) of a plurality of AC powers provided from the distributing circuit 332. A plurality of phase shifters 333 may be provided. For example, the number of phase shifters 333 provided may be the same as the patch antennas included in the power transmitting antenna array 334. A hardware element, such as an HMC642 or HMC1113, may be used as the phase shifter 333. The shift degree of each phase shifter 333 may be controlled by the control circuit 102.

The control circuit 102 may determine the position of the electronic device 150, and may shift respective phases of the plurality of AC powers such that RF waves generate constructive interference (i.e., perform beamforming) at the position of the electronic device 150 (or at the position of the power receiving antenna 341 of the electronic device 150).

The respective patch antennas included in the power transmitting antenna array 334, based on the received power, may generate sub-RF waves. The RF wave whose sub-RF waves are interfered may be converted to the current, voltage, or power by the power receiving antenna 341 to then be output.

The power receiving antenna 341 may include a plurality of patch antennas, and may generate the current, voltage, or power of an AC waveform using an RF wave (i.e., an electromagnetic wave) formed around the antenna, which may be referred to as "received power".

The rectifying circuit 342 may rectify the received power into a DC waveform.

The converting circuit 343 may increase or reduce a voltage of the power of a DC waveform to a predetermined value, and may output the changed power to the PMIC.

The power transmitting circuit 109 and/or the power receiving circuit 159 may include hardware for the induction or resonance method as illustrated in FIG. 3C and hardware for the electromagnetic-wave method as illustrated in FIG. 3D. In this case, the control circuit 102 or the control circuit 152 may select a charging method depending on various conditions, and may control to drive the appropriate hardware corresponding to the selected charging method.

Alternatively, the control circuit 102 or the control circuit 152 may use both the induction or resonance method and the electromagnetic-wave method, or may transmit and receive power by driving all of the included hardware.

Figure 4:
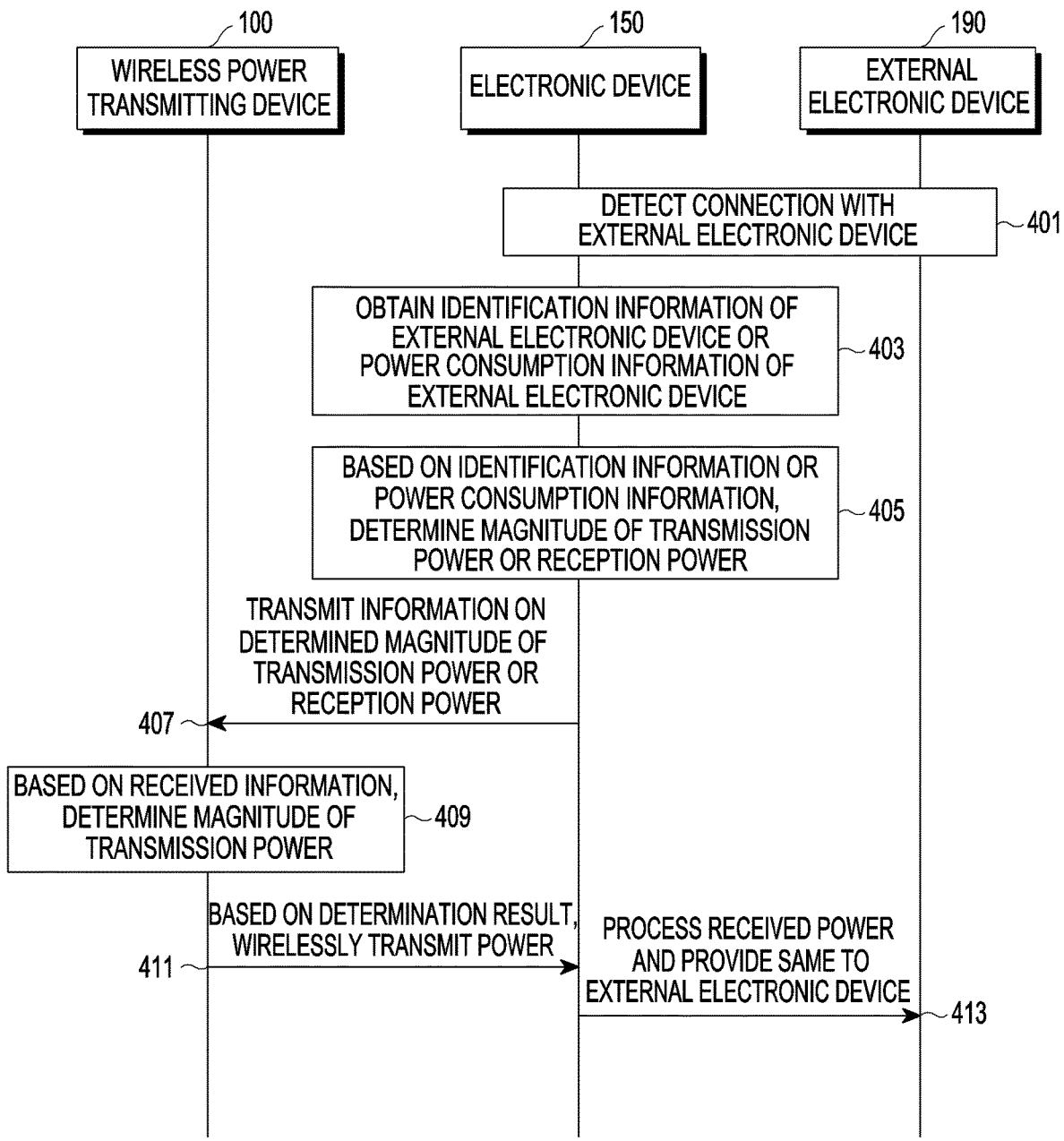
FIG. 4 is a signal flow diagram illustrating operation methods of an electronic device, a wireless power transmitting device, and an external electronic device according to an embodiment.

FIG. 4 is a signal flow diagram illustrating operation methods of an electronic device, a wireless power transmitting device, and an external electronic device according to an embodiment.

Referring to FIG. 4, in operation 401, the electronic device 150 detects a connection with the external electronic device 190. For example, the electronic device 150 may be connected to the external electronic device 190 through a wired interface (e.g., the first wired interface 155), and may detect a connection with the external electronic device 190 according to a change in the magnitude of a voltage at the wired interface, the current from the wired interface to the external electronic device 190, or the power thereof. The electronic device 150 may detect a change in the load (or impedance) due to a change in the electrical characteristics of the wired interface, and may detect a connection with the external electronic device 190 according thereto. The electronic device 150 may apply test power to the wired interface periodically or aperiodically in order to detect a change in the electrical characteristics of the wired interface. The electronic device 150 may detect the external electronic device 190 through wireless communication. The external electronic device 190 may perform wireless communicate with the electronic device 150, and the electronic device 150 may detect the external electronic device 190 using a communication signal from the external electronic device 190. The electronic device 150 may detect a connection with the external electronic device 190 through various sensors. The detection of the connection, however, is not limited to a specific method.

In operation 403, the electronic device 150 obtains identification information of the external electronic device 190 or power consumption information of the external electronic device 190. The electronic device 150 may receive a communication signal including identification information from the external electronic device 190, and may obtain identification information included in the communication signal. The electronic device 150 may provide test power to the external electronic device 190 through a wired interface. The electronic device 150 may sense a value of the voltage applied to the wireline interface and a value of the current flowing from the wired interface to the external electronic device when providing the test power. The electronic device 150 may refer to a pre-stored lookup table indicating a relationship between current and voltage values and power consumption of the external electronic device 190 in order to detect the power consumption of the external electronic device 190. The electronic device 150 may input the sensed result to a pre-stored equation having variables of a current value, a voltage value, and power consumption of the external electronic device 190 in order to determine the power consumption of the external electronic device 190.

In operation 405, the electronic device 150, based on the identification information or the power consumption information, determines the magnitude of the transmission power to be transmitted by the wireless power transmitting device 100 or the magnitude of the reception power to be received by the electronic device 150.

In operation 407, the electronic device 150 transmits information on the determined magnitude of the transmission power or reception power, e.g., through a communication circuit.

In operation 409, the wireless power transmitting device 100, based on the received information, determines the magnitude of the transmission power. For example, the electronic device 150 may store association information between identification information of the external electronic device and the magnitude of the transmission power to be transmitted by the wireless power transmitting device 100, as shown in Table 1.

TABLE 1

| External electronic device | Magnitude of transmission power |
| --- | --- |
| First model TV | 300 W |
| Second model TV | 500 W |
| Third model speaker | 150 W |
| Fourth model speaker | 800 W |

The electronic device 150 or the wireless power transmitting device 100 may pre-store the association information, or may receive updated association information through communication with a server. The electronic device 150 may detect that a connected external electronic device is, e.g., a second model TV, and may identify that the magnitude of the power to be transmitted by the wireless power transmitting device 100 is 500 W using the association information in Table 1. The association information shown in Table 1 may be generated according to the power consumption of each external electronic device, the power consumption of the electronic device 150, and the wireless power transmission/reception efficiency. Based on an arrangement relationship with the wireless power transmitting device 100 or the distance thereto, the electronic device 150 may update the magnitude of the transmission power of the association information in Table 1. The wireless power transmitting device 100 may receive a communication signal including information on the magnitude of the transmission power (e.g., 500 W) from the electronic device 150. The wireless power transmitting device 100, based on the information on the magnitude of the transmission power (i.e., 500 W), may determine the magnitude of the transmission power.

For example, the electronic device 150 may store association information between identification information of the external electronic device and the magnitude of the reception power to be received by the electronic device 150, as shown in Table 2.

TABLE 2

| External electronic device | Magnitude of reception power |
| --- | --- |
| First model TV | 250 W |
| Second model TV | 380 W |
| Third model speaker | 90 W |
| Fourth model speaker | 710 W |

The electronic device 150 may detect that a connected external electronic device is, e.g., a second model TV, and may determine that the magnitude of the power to be received by the electronic device 150 is 380 W using the association information in Table 2. The association information shown in Table 2 may be generated according to the power consumption of each external electronic device and the power consumption of the electronic device 150. The wireless power transmitting device 100 may receive a communication signal including information on the magnitude of the reception power (e.g., 380 W) from the electronic device 150. The wireless power transmitting device 100, based on the information on the magnitude of the reception power (i.e., 380 W), may determine the magnitude of the transmission power. For example, the wireless power transmitting device 100 may transmit power having a magnitude greater than that in the information on the magnitude of the reception power by considering the wireless power transmission/reception efficiency. The wireless power transmitting device 100 may predetermine the transmitted/reception efficiency depending on a variety of magnitudes of the transmission power for testing.

For example, the electronic device 150 may store association information between the power consumption of the external electronic device and the magnitude of the transmission power to be transmitted by the wireless power transmitting device 100, as shown in Table 3.

TABLE 3

| Power consumption of external electronic device | Magnitude of transmission power |
| --- | --- |
| 100 W | 200 W |
| 200 W | 500 W |
| 300 W | 900 W |
| 400 W | 1500 W |

For example, the electronic device 150 may determine the power consumption of the external electronic device 190 by multiplying the magnitude of a voltage of the wired power interface by the magnitude of the power applied from the wired power interface to the external electronic device 190. The electronic device 150 may determine that the magnitude of the power to be transmitted by the wireless power transmitting device 100 is 900 W using the determined power consumption (e.g., 300 W) and the association information in Table 3. The association information shown in Table 3 may be generated according to the power consumption of the external electronic device, the power consumption of the electronic device 150, and the wireless power transmission/reception efficiency. The electronic device 150, based on an arrangement relationship with the wireless power transmitting device 100 or the distance thereto, may update the magnitude of the transmission power of the association information in Table 3. The wireless power transmitting device 100 may receive a communication signal including information on the magnitude of the transmission power (e.g., 900 W) from the electronic device 150. The wireless power transmitting device 100, based on the information on the magnitude of the transmission power (e.g., 900 W), may determine the magnitude of the transmission power.

For example, the electronic device 150 may store association information between the power consumption of the external electronic device and the magnitude of the reception power received by the electronic device 150, as shown in Table 4.

TABLE 4

| Power consumption of external electronic device | Magnitude of reception power |
|---|---|
| 100 W | 150 W |
| 200 W | 250 W |
| 300 W | 350 W |
| 400 W | 450 W |

For example, the electronic device 150 may detect that the power consumption of a connected external electronic device is 300 W, and may determine that the magnitude of the reception power to be received by the electronic device 150 is 350 W using the association information in Table 4. The association information shown in Table 4 may be generated according to the power consumption of each external electronic device and the power consumption of the electronic device 150. The wireless power transmitting device 100 may receive a communication signal including information on the magnitude of the reception power (e.g., 350 W) from the electronic device 150. The wireless power transmitting device 100, based on the information on the magnitude of the reception power (e.g., 350 W), may determine the magnitude of the transmission power. For example, the wireless power transmitting device 100 may transmit power having a magnitude greater than that of the reception power of the information in consideration of wireless power transmission/reception efficiency.

The electronic device 150 may process the received power according to the rated voltage, the rated current, and/or the rated power corresponding to the identification information of the external electronic device 190, and may provide the processed power to the external electronic device 190. The electronic device 150 may also process the received power depending on the power consumption of the external electronic device 190, and may provide the processed power to the external electronic device 190.

Although the magnitude of the transmission power or the magnitude of the reception power is set in a unit of W in Tables 1 to 4, these are merely examples, and it will be readily understood by those skilled in the art that any unit, which can indicate the magnitude of wirelessly transmitted or received energy, such as V, A, etc., can be used.

Alternatively, the magnitude of the transmission power may be mapped as an index having a smaller amount of data, and the power transmitting device 100 and the electronic device 150 may pre-share a mapping relationship between index information and magnitude-related information. Accordingly, the wireless power transmitting device 100 and the electronic device 150 may transmit and receive indexes, thereby reducing the amount of data for communication signals.

In operation 411, based on the determination result, the wireless power transmitting device 100 wirelessly transmits power.

In operation 413, the electronic device 150 processes the received power in order to provide the processed power to the external electronic device 190.

The power consumption of the external electronic device 190 may vary with time. For example, when the external electronic device 190 is a TV set, the power consumption may vary depending on a change in the media data to be output or on a change in the TV setting (e.g., display brightness, volume, execution of data communication, 3D processing, high-quality image processing, contrast, light and shade, or a viewing mode). The electronic device 150 may determine the magnitude of the transmission power or the magnitude of the reception power depending on a change in the power consumption, and may transmit the determined magnitude to the wireless power transmitting device 100. The wireless power transmitting device 100 may adjust the magnitude of the transmission power according to the received information.

Figure 5:
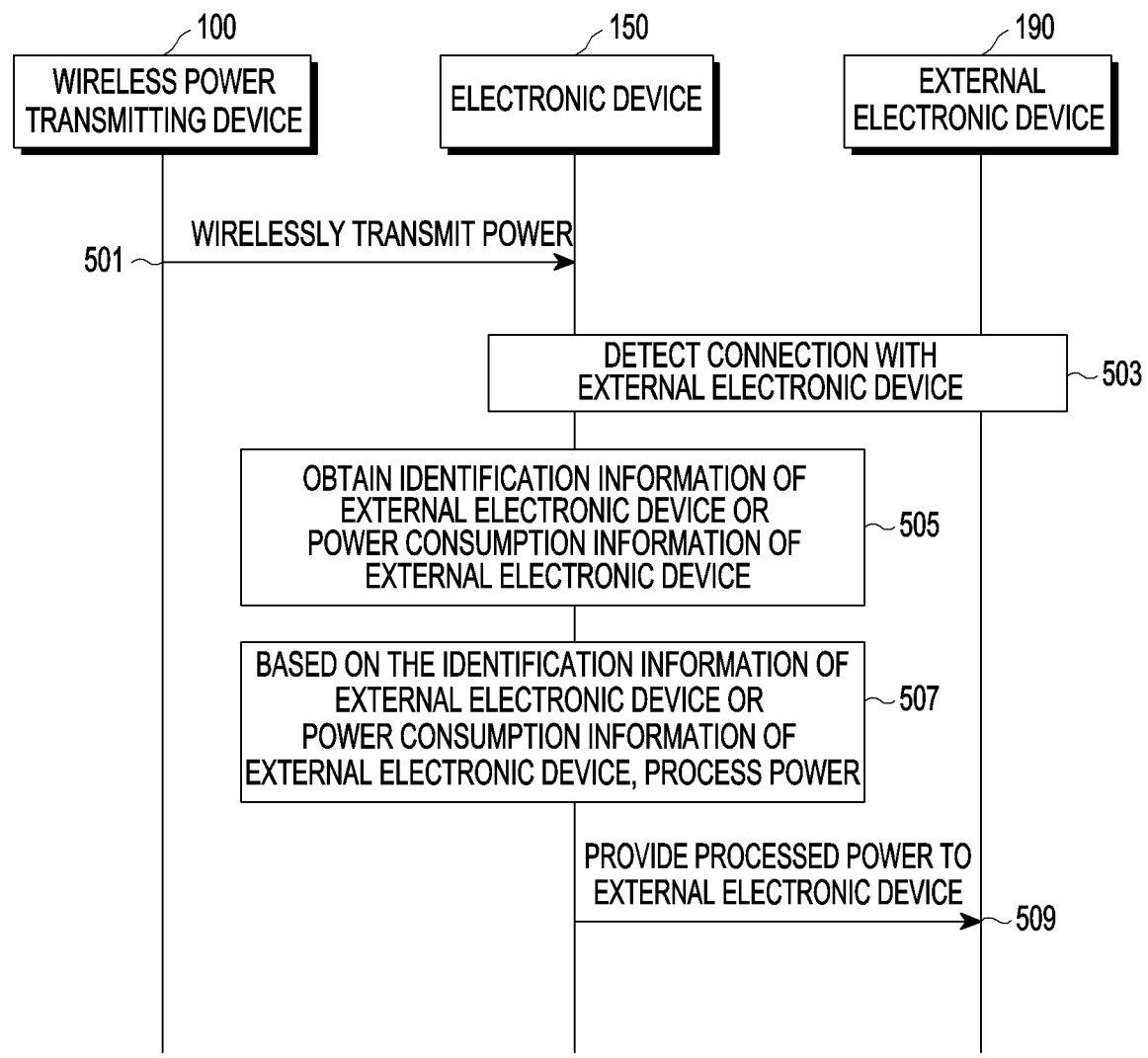
FIG. 5 is a signal flow diagram illustrating operation methods of an electronic device, a wireless power transmitting device, and an external electronic device according to an embodiment.

FIG. 5 is a signal flow diagram illustrating operation methods of an electronic device, a wireless power transmitting device, and an external electronic device according to an embodiment.

Referring to FIG. 5, in operation 501, the electronic device 150 wirelessly receives power from the wireless power transmitting device 100.

In operation 503, the electronic device 150 detects a connection with the external electronic device 190.

In operation 505, the electronic device 150 obtains identification information of the external electronic device 190 or power consumption information of the external electronic device 190.

In operation 507, based on the identification information of the external electronic device 190 or the power consumption information of the external electronic device 190, the electronic device 150 processes the power. For example, based on the identification information of the external electronic device 190, the electronic device 150 may confirm that the rated voltage of the external electronic device 190 is 220V, the rated current thereof is 1 A, and the rated power thereof is 220 A. The electronic device 150 may change at least one of the voltage, current, or magnitude of the wirelessly received power to conform to the external electronic device 190, and may provide the processed power through the wired interface. Alternatively, the electronic device 150, based on the confirmed power consumption of the external electronic device 190, may process the wirelessly received power.

In operation 509, the electronic device 150 provides the processed power to the external electronic device 190. The electronic device 150 may convert the reception power into AC power available in the country in which the electronic device 150 is used, and may provide the converted power to the external electronic device 190. In this case, the electronic device 150 may change the amplitude and/or the frequency of the AC power in order to provide the changed characteristic of the AC power to the external electronic device 190. The electronic device 150 may convert the reception power into DC power in order to provide the DC power to the external electronic device 190. In this case, the external electronic device 190 may use the power supplied from the electronic device 150 without performing rectification.

Figure 6:
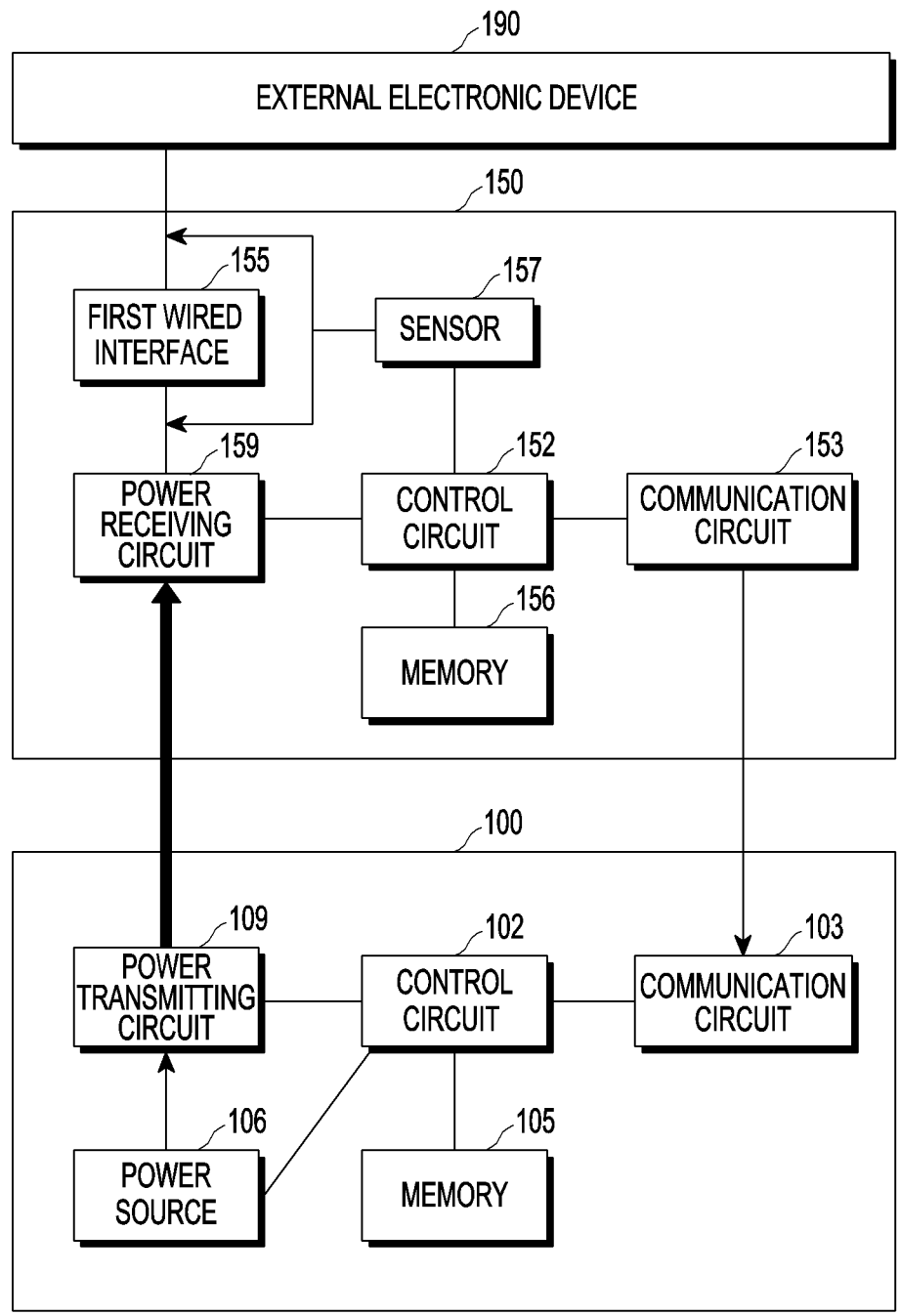
FIG. 6 illustrates an electronic device, a wireless power transmitting device, and an external electronic device according to an embodiment.

FIG. 6 illustrates an electronic device, a wireless power transmitting device, and an external electronic device according to an embodiment.

Referring to FIG. 6, compared with FIG. 3A, the electronic device 150 further includes a sensor 157 that may detect at least one of the magnitude of a voltage, the magnitude of a power, or the magnitude of a current. The sensor 157 may sense a value of the current flowing to the external electronic device 190 through the first wired interface 155, and may sense a value of the voltage applied to the first wired interface 155. The control circuit 152 may determine the power consumption or the rated power of the external electronic device 190 using the current value and voltage value obtained from the sensor 157.

Figure 7:
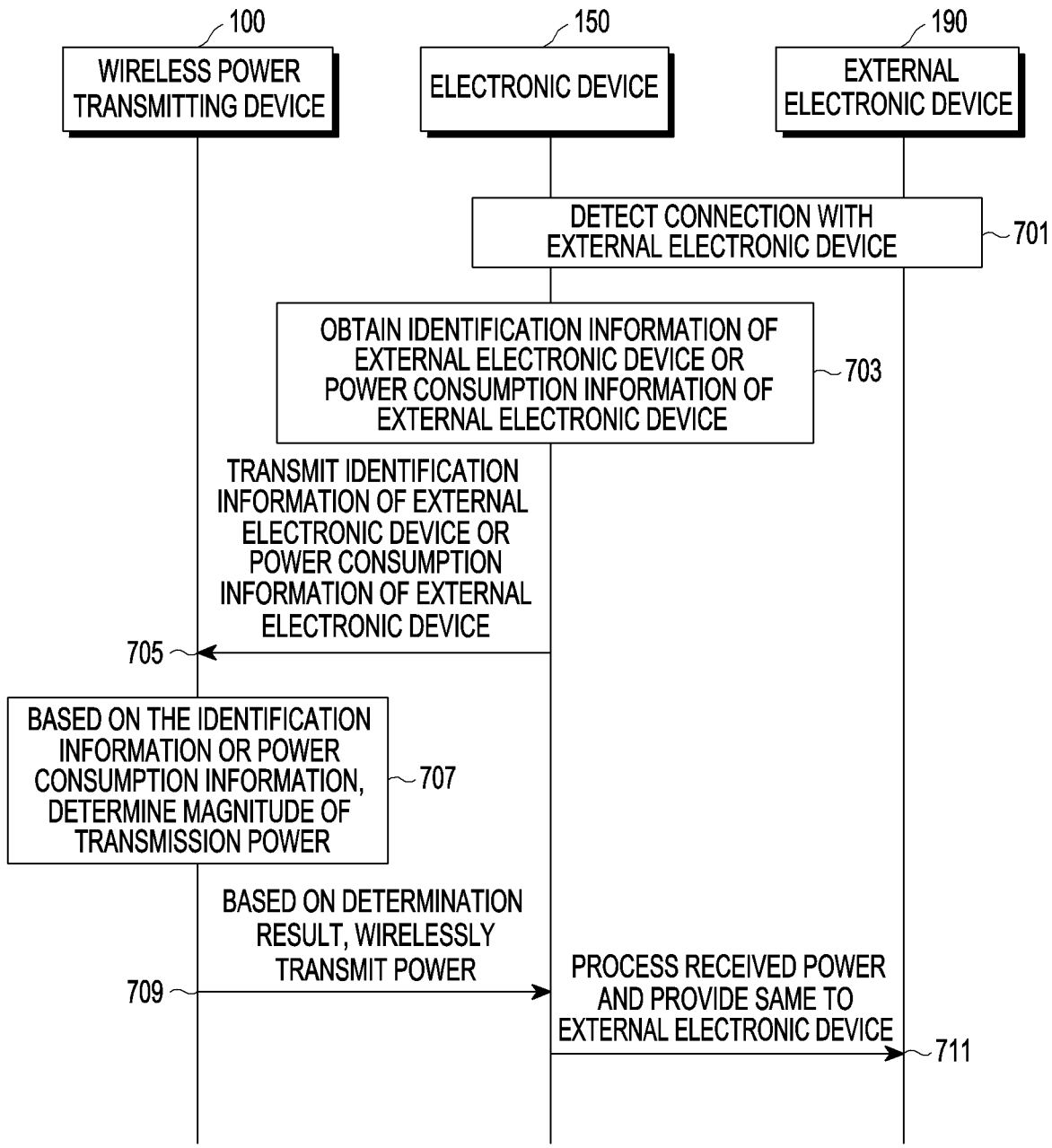
FIG. 7 is a signal flow diagram illustrating operation methods of an electronic device, a wireless power transmitting device, and an external electronic device according to an embodiment.

FIG. 7 is a signal flow diagram illustrating operation methods of an electronic device, a wireless power transmitting device, and an external electronic device according to an embodiment.

Referring to FIG. 7, in operation 701, the electronic device 150 detects a connection with the external electronic device 190.

In operation 703, the electronic device 150 obtains identification information of the external electronic device 190 or power consumption information of the external electronic device 190.

In operation 705, the electronic device 150 transmits the identification information of the external electronic device 190 or the power consumption information of the external electronic device 190 to the wireless power transmitting device 100 through wireless communication.

In operation 707, the wireless power transmitting device 100, based on the identification information or power consumption information of the external electronic device 190, determines the magnitude of the transmission power. For example, the wireless power transmitting device 100 may pre-store association information as shown in Table 1 or Table 3. The wireless power transmitting device 100 may compare the information included in the communication signal with the association information shown in Table 1 or Table 3 to thus determine the magnitude of the transmission power.

In operation 709, the wireless power transmitting device 100, based on the determination result, wirelessly transmits power.

In operation 711, the electronic device 150 processes the received power in order to provide the processed power to the external electronic device 190.

Figure 8A:
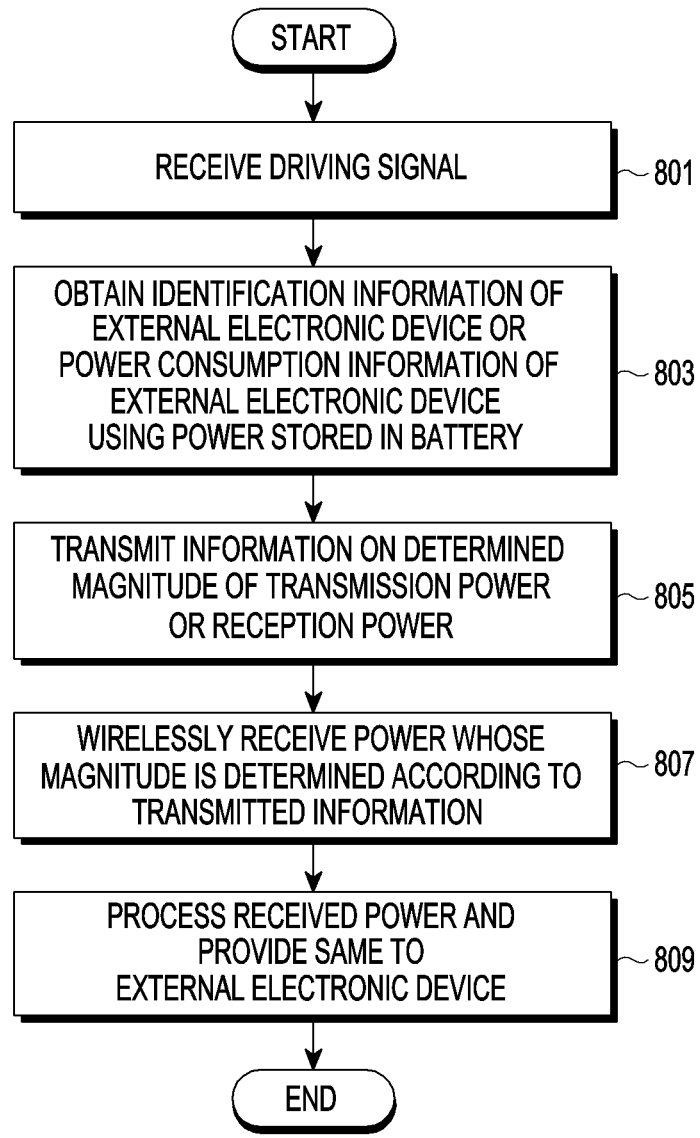
FIGS. 8A and 8B are flowcharts illustrating operation methods of an electronic device according to an embodiment.
Figure 8B:
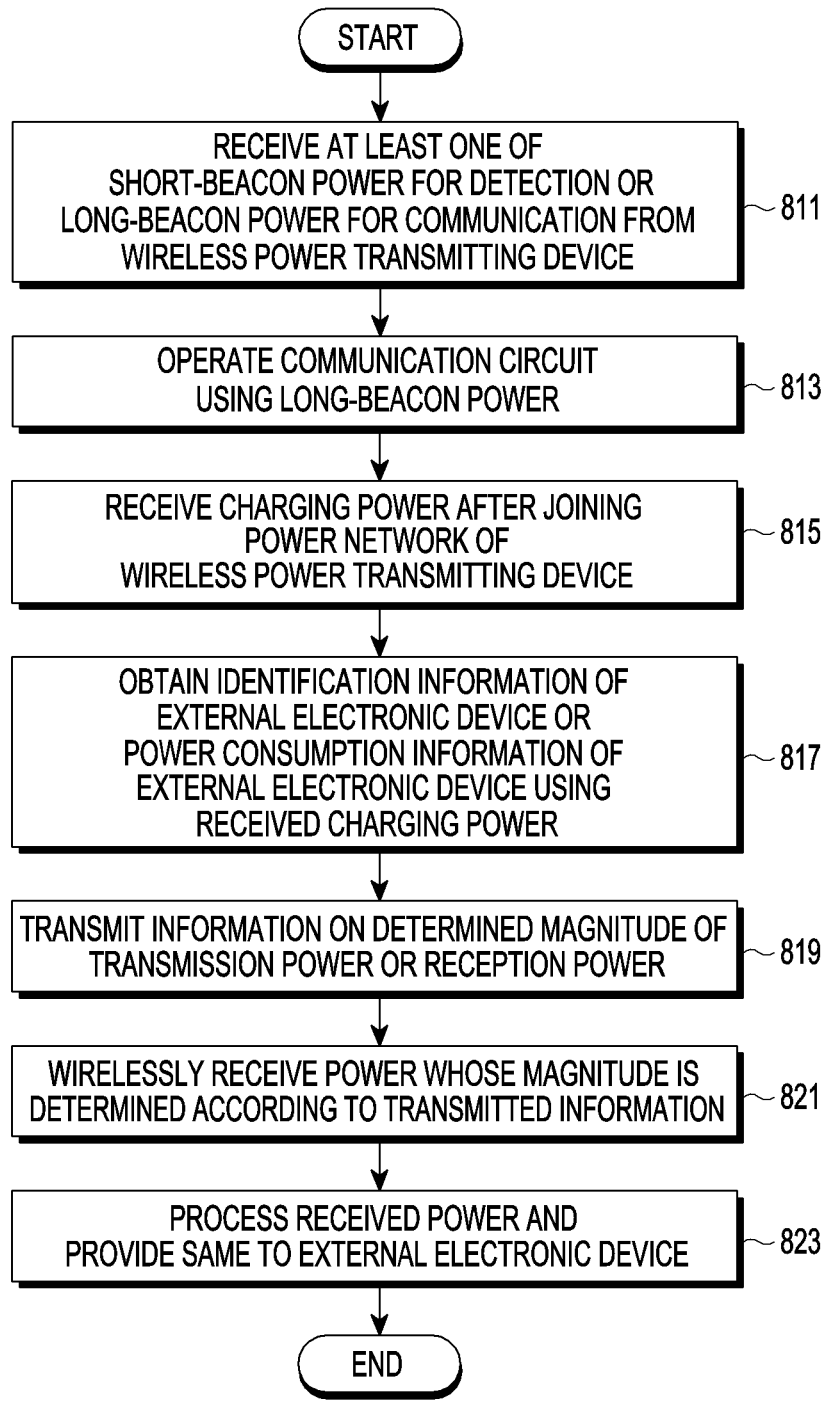

FIGS. 8A and 8B are flowcharts illustrating operation methods of an electronic device according to an embodiment.

Referring to FIG. 8A, in step 803, the electronic device 150 obtains identification information of the external electronic device 190 or power consumption information of the external electronic device 190 using the power stored in the battery. The electronic device 150 may provide test power through a wired interface using the power stored in the battery. The electronic device 150 may sense at least one of the magnitude of a voltage, the magnitude of a current, or the magnitude of power for the wire interface, and, based on the sensed result, may obtain identification information of the external electronic device 190 or power consumption information of the external electronic device 190. The electronic device 150 may drive a communication circuit included therein using the power stored in the battery, and, based on a communication signal received through a communication circuit, may obtain the identification information of the external electronic device 190 or the power consumption information of the external electronic device 190.

In step 805, the electronic device 150 transmits, to the wireless power transmitting device 100, information on the determined magnitude of the transmission power or reception power.

In step 807, the electronic device 150 wirelessly receives the power, the magnitude of which has been determined according to the transmitted information.

In step 809, the electronic device 150 processes the received power in order to provide the processed power to the external electronic device 190.

As described above, the electronic device 150 may be operated using the power pre-stored in the battery prior to wirelessly receiving the power.

Referring to FIG. 8B, in step 811, the electronic device 150 receives, from the wireless power transmitting device 100, at least one of short-beacon power for detection of a charging object or long-beacon power for communication. The wireless power transmitting device 100 may apply short-beacon power to a resonance circuit in a predetermined period in order to detect an impedance change caused by an object placed in the charging area according to the A4WP standard. The short-beacon power may be transferred to a coil of the electronic device 150 through magnetic coupling. When an impedance change in the resonance circuit is detected while applying the short-beacon power, the wireless power transmitting device 100 may apply the long-beacon power to be used to transmit a communication signal (e.g., an advertisement signal defined in the BLE standard) in a communication circuit of the electronic device 150. The long-beacon power may also be transferred from a coil in the resonance circuit of the wireless power transmitting device 100 to a coil of the electronic device 150 according to magnetic coupling.

In step 813, the electronic device 150 drives a communication circuit using the long-beacon power, and transmits a communication signal (e.g., an advertisement signal defined in the BLE standard) through a communication circuit.

In step 815, the electronic device 150 receives charging power after joining the power network of the wireless power transmitting device 100. For example, the electronic device 150 may exchange a variety of information defined in the A4WP with the wireless power transmitting device 100, and may enter a power transfer state through a power save state and a low-power state.

In step 817, the electronic device 150 obtains identification information of the external electronic device 190 or power consumption information of the external electronic device 190 using the received charging power.

In step 819, the electronic device 150 transmits, to the wireless power transmitting device 100, information on the determined magnitude of the transmission or reception power. For example, the electronic device 150 may include the corresponding information in a PRU dynamic signal defined in the A4WP in order to transmit the corresponding information.

Table 5 below illustrates data fields of a PRU dynamic signal according to an embodiment.

TABLE 5

| Field | Octets | Description | Use | Units |
|---|---|---|---|---|
| Optional fields validity | 1 | Defines which optional fields are populated | Mandatory | |
| $V_{RECT}$ | 2 | DC voltage at the output of the rectifier. | Mandatory | mV |
| $I_{RECT}$ | 2 | DC current at the output of the rectifier. | Mandatory | mA |
| $V_{OUT}$ | 2 | Voltage at charge/battery port | Optional | mV |
| $I_{OUT}$ | 2 | Current at charge/battery port | Optional | mA |
| $T_{RATIO}$ | 1 | Current temperature of PRU relative to its OTP temperature | Optional | Bit field |
| $V_{RECT\_MIN\_DYN}$ | 2 | The current dynamic minimum rectifier voltage desired | Optional | mV |
| $V_{RECT\_SET\_DYN}$ | 2 | Desired $V_{RECT}$ (dynamic value) | Optional | mV |
| $V_{RECT\_HIGH\_DYN}$ | 2 | The current dynamic maximum rectifier voltage desired | Optional | mV |
| PRU alert | 1 | Warnings | Mandatory | Bit field |
| Tester Command | 1 | PTU Test Mode Command | Optional | Bit Field |
| RFU | 2 | Undefined | | |

In Table 5, the optional fields validity field may define optional fields that are to be filled, the $V_{RECT}$ field may denote a voltage value measured at an output terminal of a rectifying circuit of the electronic device 150, the $I_{RECT}$ field may denote a current value measured at an output terminal of a rectifying circuit of the electronic device 150, the $V_{OUT}$ field may denote a voltage value measured at an output terminal of a converting circuit of the electronic device 150, the $I_{OUT}$ field may denote a current value measured at an output terminal of a converting circuit of the electronic device 150, $T_{RATIO}$ may denote information related to the current temperature, the $V_{RECT\_MIN\_DYN}$ field may denote the minimum voltage value required at an output terminal of a rectifying circuit of the electronic device 150, the $V_{RECT\_HIGH\_DYN}$ field may denote the maximum voltage value required at an output terminal of a rectifying circuit of the electronic device 150, the $V_{RECT\_SET\_DYN}$ field may denote a value between the maximum voltage value and the minimum voltage value, which is required at an output terminal of a rectifying circuit of the electronic device 150, the "PRU alert" may be warning information, the "Tester Command" may be a test mode command of the wireless power transmitting device 100, and the "RFU (reserved for future use)" may be a field left for undefined future usage.

The electronic device 150 may include information on the determined magnitude of the transmission power or reception power in the RFU field in order to transmit the same to the wireless power transmitting device 100. Alternatively, the electronic device 150 may allow the wireless power transmitting device 100 to change the magnitude of the transmission power by changing a value of at least one of the $V_{RECT\_MIN\_DYN}$ field, the $V_{RECT\_HIGH\_DYN}$ field, or the $V_{RECT\_SET\_DYN}$ field. For example, based on rated power information or power consumption information of the external electronic device 190, the electronic device 150 may set a value of at least one of the $V_{RECT\_MIN\_DYN}$ field, the $V_{RECT\_HIGH\_DYN}$ field, or the $V_{RECT\_SET\_DYN}$ field to be different from the value of at least one of the $V_{RECT\_MIN\_DYN}$ field, the $V_{RECT\_HIGH\_DYN}$ field, or the $V_{RECT\_SET\_DYN}$ field included in the "PRU static". The wireless power transmitting device 100 may analyze a communication signal, thereby adjusting the magnitude of the transmission power.

For example, when information is included in the RFU of the PRU Dynamic, the wireless power transmitting device 100 may analyze the information included in the RFU to thus adjust the magnitude of the transmission power. When the $V_{RECT\_MIN\_DYN}$ field, the $V_{RECT\_HIGH\_DYN}$ field, or the $V_{RECT\_SET\_DYN}$ field of the PRU Dynamic varies from a previously stored value, the wireless power transmitting device 100 may adjust the magnitude of the transmission power such that the $V_{RECT}$ of the electronic device 150 belongs to the range determined by the $V_{RECT\_MIN\_DYN}$ field, the $V_{RECT\_HIGH\_DYN}$ field, or the $V_{RECT\_SET\_DYN}$ field.

In step 821, the electronic device 150 wirelessly receives the power the magnitude of which has been adjusted according to the transmitted information.

In step 823, the electronic device 150 processes the received power in order to provide the processed power to the external electronic device 190.

The electronic device 150 may obtain identification information (e.g., information on the rated power) or power consumption information of the external electronic device 190 using the long-beacon power received in a low-power state. In this case, the electronic device 150 may determine the $V_{RECT\_MIN\_DYN}$ field, the $V_{RECT\_HIGH\_DYN}$ field, or the $V_{RECT\_SET\_DYN}$ field by considering the information on the rated power or the power consumption information of the external electronic device 190, in addition to those of the electronic device 150. The electronic device 150 may include the determined value in the "PRU static", and may transmit the determined value to the wireless power transmitting device 100. The wireless power transmitting device 100 enters a power transfer state, and may determine the magnitude of charging power such that the $V_{RECT}$ of the electronic device 150 belongs to the range determined by the $V_{RECT\_MIN\_DYN}$ field, the $V_{RECT\_HIGH\_DYN}$ field, or the $V_{RECT\_SET\_DYN}$ field included in the "PRU static".

Figure 9:
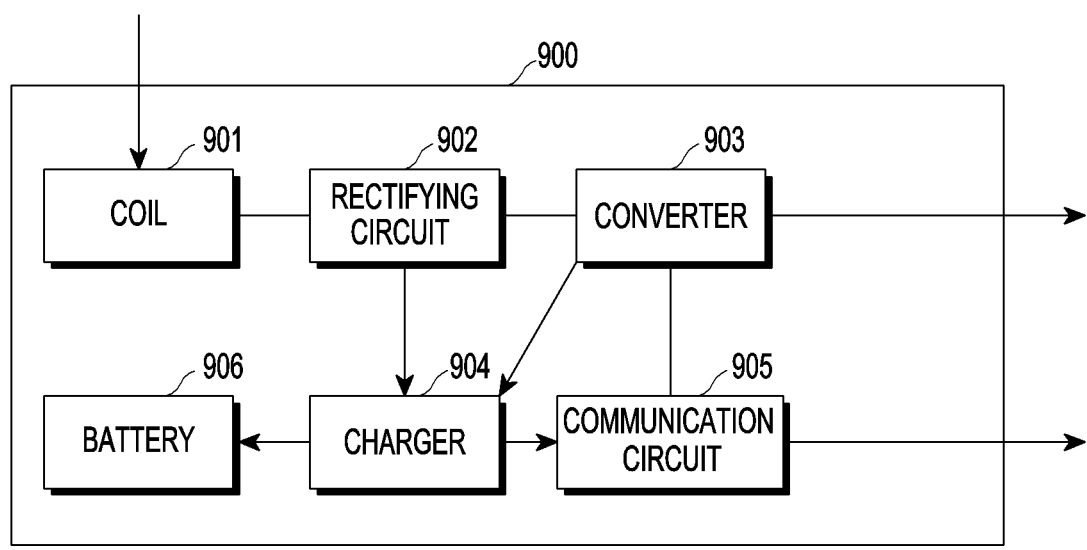
FIG. 9 illustrates an electronic device according to an embodiment.

FIG. 9 illustrates an electronic device according to an embodiment.

Referring to FIG. 9, the electronic device 900 includes a coil 901, a rectifying circuit 902, a converter 903, a charger 904, a communication circuit 905, and a battery 906. The coil 901 may wirelessly receive power from the wireless power transmitting device 150. The coil 901, based on a magnetic field formed therearound, the magnitude of which varies with time, may generate an induced electromotive force.

The rectifying circuit 902 may rectify the received AC power to then transmit the rectified power to the converter 903 or the charger 904. The converter 903 may convert the voltage of the rectified power in order to transmit the converted voltage power to the external electronic device 190. The converter 903 may convert the voltage according to the rated power information or power consumption information of external electronic device 190, and may provide the converted power to external electronic device 190. The converter 903 may also convert the power according to the rated power information of the charger 904 and the communication circuit 905, respectively, and may provide the converted power thereto.

The communication circuit 905 may perform wireless communication with the external electronic device 190 or the wireless power transmitting device 100 using the provided power. The charger 904 may charge the battery 906 using the received power. When no power is received in the coil 901, the power stored in the battery 906 may be provided to the external electronic device 190. The power stored in the battery 906 may be provided to the external electronic device 190 through the converter 903, and the converter 903 may up-convert the power received from the battery 906. Alternatively, the power stored in the battery 906 may first be converted to AC power and then be transferred to the external electronic device 190.

FIGS. 10A to 10E illustrate an electronic device according to an embodiment.

Figure 10A:
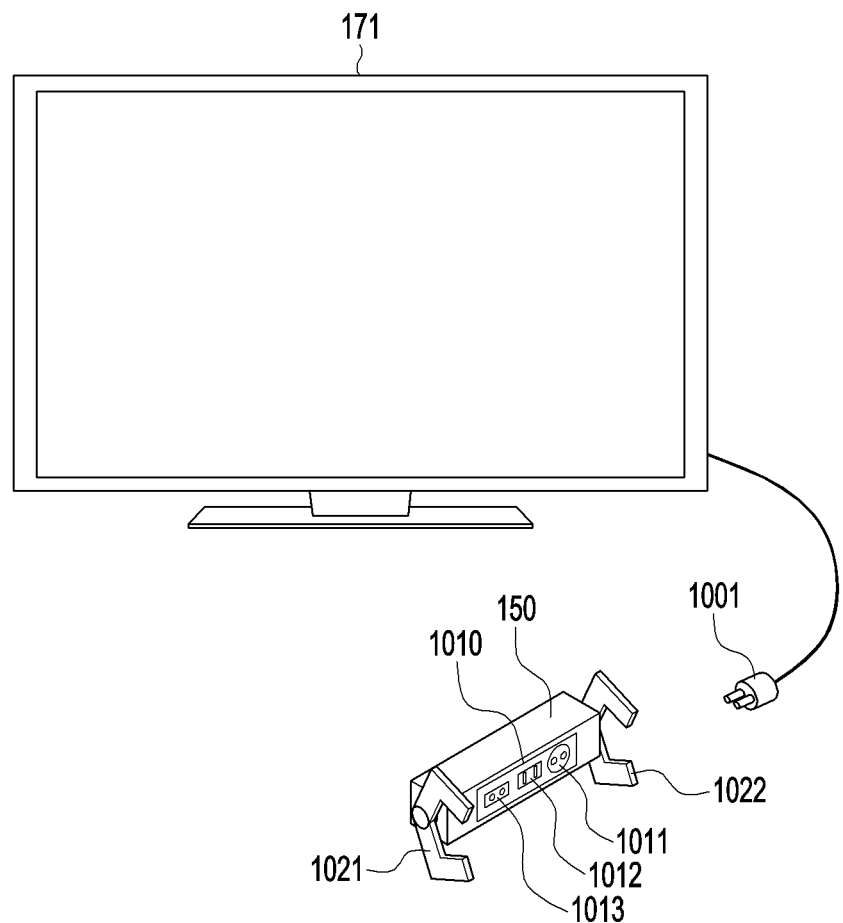
FIGS. 10A to 10E illustrate an electronic device according to an embodiment.

Referring to FIG. 10A, the electronic device 150 includes wired interfaces 1011, 1012, and 1013. The wired interfaces 1011, 1012, and 1013 may be implemented as sockets having a form for receiving a plug of an external electronic device therein. For example, a TV set 171 may include a plug 1001 for 220V, and the 220V-plug 1001 may be inserted into the wired interface 1011 for 220V.

The external electronic device may include various types of plugs according to various standards, and the electronic device 150 may include various types of sockets for receiving various types of plugs. Thus, the electronic device 150 may be connected to various external electronic devices (e.g., 171 and 172), as illustrated in FIGS. 2A and 2B, in order to wirelessly receive and transmit power.

The electronic device 150 includes fasteners 1021 and 2022, which are implemented as clips.

Figure 10B:
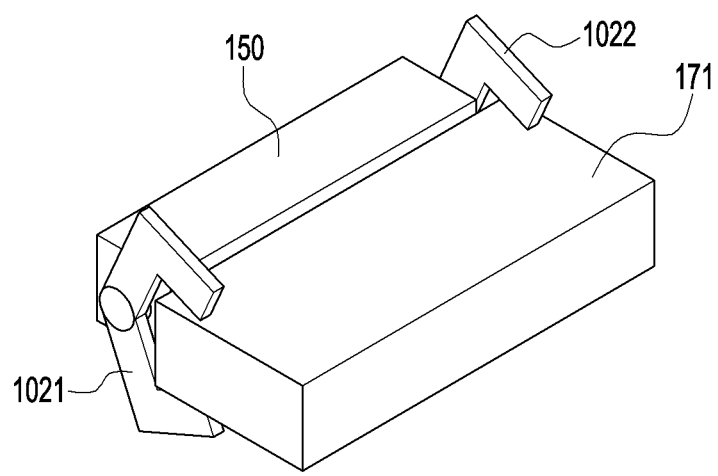

Referring to FIG. 10B, the fasteners 1021 and 1022 may couple to a portion of a housing of the external electronic device 171, and thus, the electronic device 150 may be fixed to the external electronic device 171. Those skilled in the art will readily understand that the fasteners 1021 and 1022 are not limited to a specific form as long as they can fix the electronic device 150 to an external electronic device.

Figure 10C:
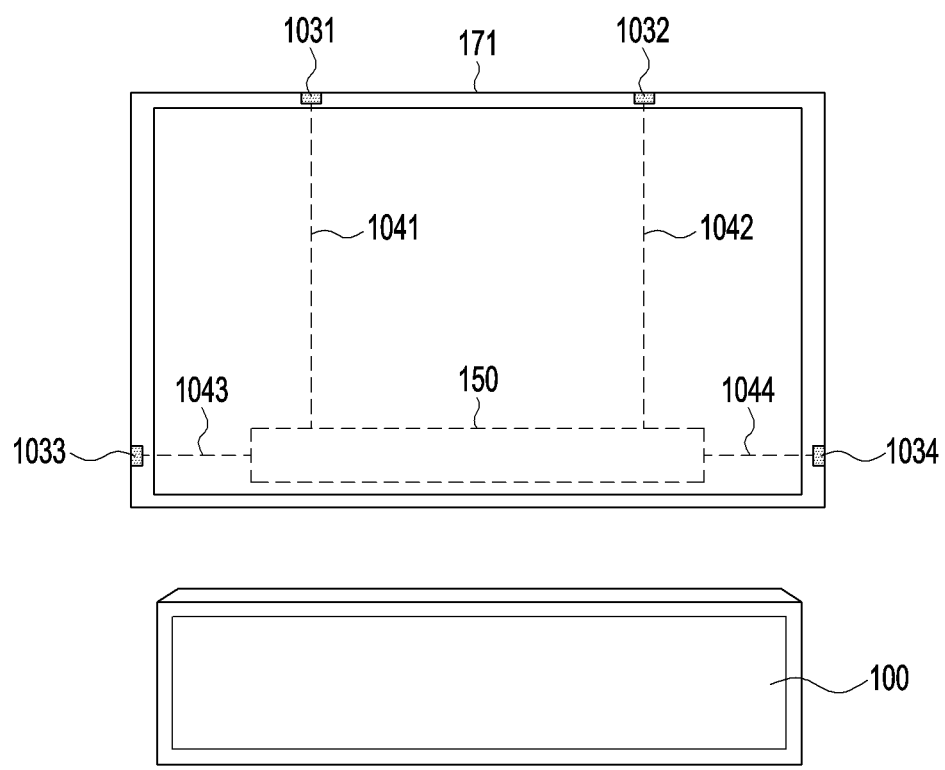

Referring to FIG. 10C, the electronic device 150 may be fixed to a surface opposite the surface on which a display of the TV set 171 is exposed (i.e., the back surface of the TV by using straps 1041, 1042, 1043, and 1044 connected to fastening areas 1031, 1032, 1033, and 1034 and the electronic device 150. The fastening areas 1031, 1032, 1033, and 1034 may be directly coupled to the TV set 171.

Figure 10D:
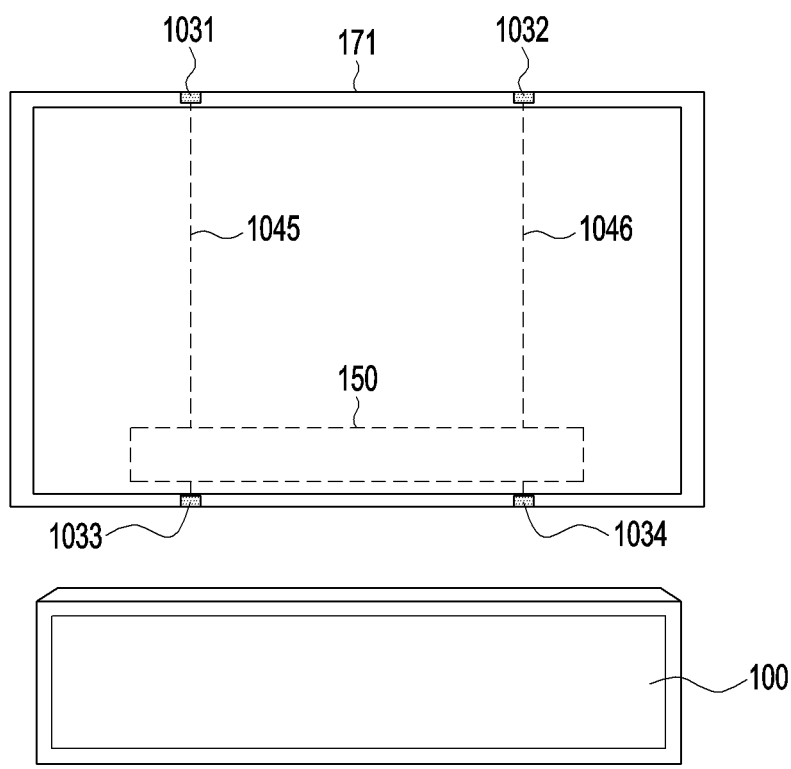

Referring to FIG. 10D, the positions of the fastening areas 1031, 1032, 1033, and 1034 are not limited, and accordingly, the number of the straps 1045 and 1046 is not limited.

As illustrated in FIGS. 10C and 10D, when the electronic device 150 is fixed by the straps, the fixing position of the electronic device 150 may be more flexible.

Figure 10E:
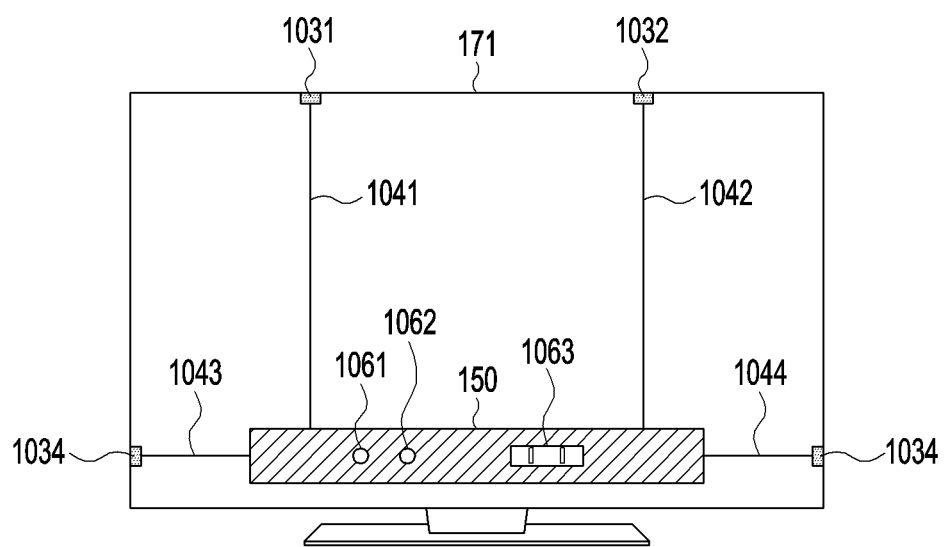

Referring to FIG. 10E, a media data interface and a power interface of the electronic device 150 may be connected to a media data interface 1061 and a power interfaces 1062 and 1063 of the TV set 171, respectively.

Figure 11:
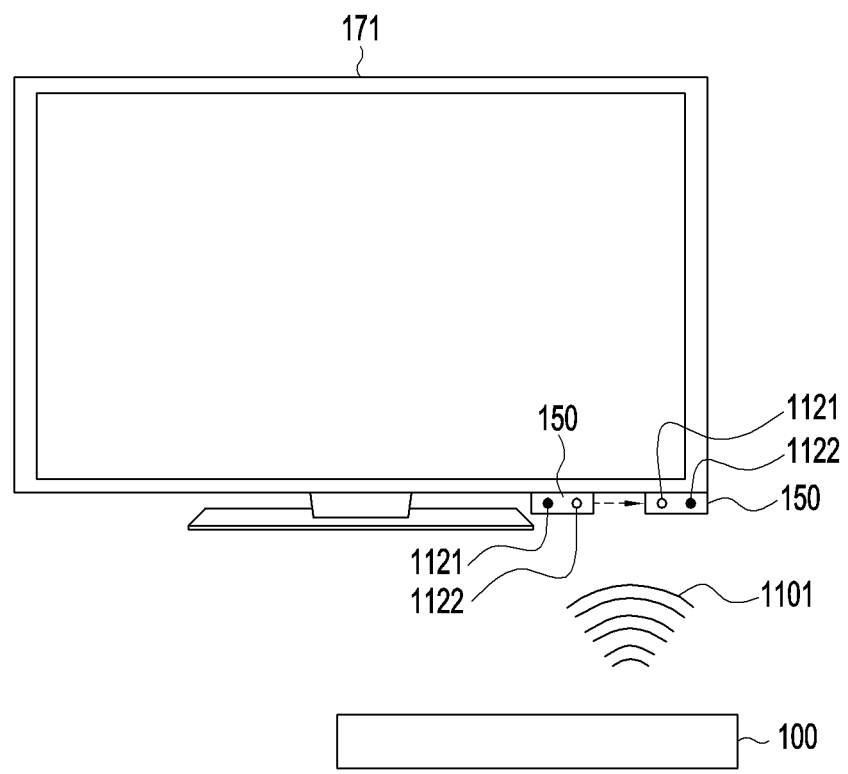
FIG. 11 illustrates an electronic device according to an embodiment.

FIG. 11 illustrates an electronic device according to an embodiment.

Referring to FIG. 11, the electronic device 150 is connected to a lower end of the TV set 171. The electronic device 150 may include simple output devices 1121 and 1122, e.g., as light emitting diodes (LEDs). The electronic device 150 may wirelessly receive power 1101 from the wireless power transmitting device 100. The arrangement of the wireless power transmitting device 100 and the electronic device 150 may vary depending on the position of the electronic device 150, and thus, the magnitude of the power received by the electronic device 150 may also vary.

The electronic device 150 may detect the magnitude of received power (e.g., the magnitude of a voltage or current at an input or output terminal of the rectifying circuit), and may determine whether or not the magnitude of the power exceeds a threshold value. A sensor, which is able to sense the magnitude of at least one of a voltage or a current, may measure the magnitude of at least one of a voltage or a current at an input or output terminal of the rectifying circuit. If it is determined that the magnitude of the power does not exceed a threshold value, the electronic device 150 may emit light, e.g., through the left output device 1121. Accordingly, the user may recognize that the reception power is not strong enough, and thus, may change the position of the electronic device 150.

If it is determined that the magnitude of the power exceeds the threshold value, the electronic device 150 may emit light, e.g., through the right output device 1122. The user may confirm that the electronic device 150 has been fixed at the proper position by recognizing the light output from the right output device 1122.

Alternatively, the user may change the position of the wireless power transmitting device 100 while maintaining the position of the electronic device 150, and if it is determined that the magnitude of the power exceeds a threshold value, the electronic device 150 may output light through the right output device 1122. The electronic device 150 may also emit lights of different colors through a single LED, thereby informing of whether or not the electronic device 150 has been disposed at a proper position.

The electronic device 150 may include a display, and may display, on the display, information on power management, information related to arrangement, information on the magnitude of wirelessly received power, information on a connected external electronic device, information on media data, etc.

The electronic device 150 may output a first type of indication through the output device if the magnitude of at least one of a voltage or a current at an input or output terminal of the rectifying circuit satisfies a first predetermined condition, and may output a second type of indication through the output devices 1121 and 1122 if the magnitude of at least one of a voltage or a current at an input or output terminal of the rectifying circuit satisfies a second predetermined condition.

Figure 12:
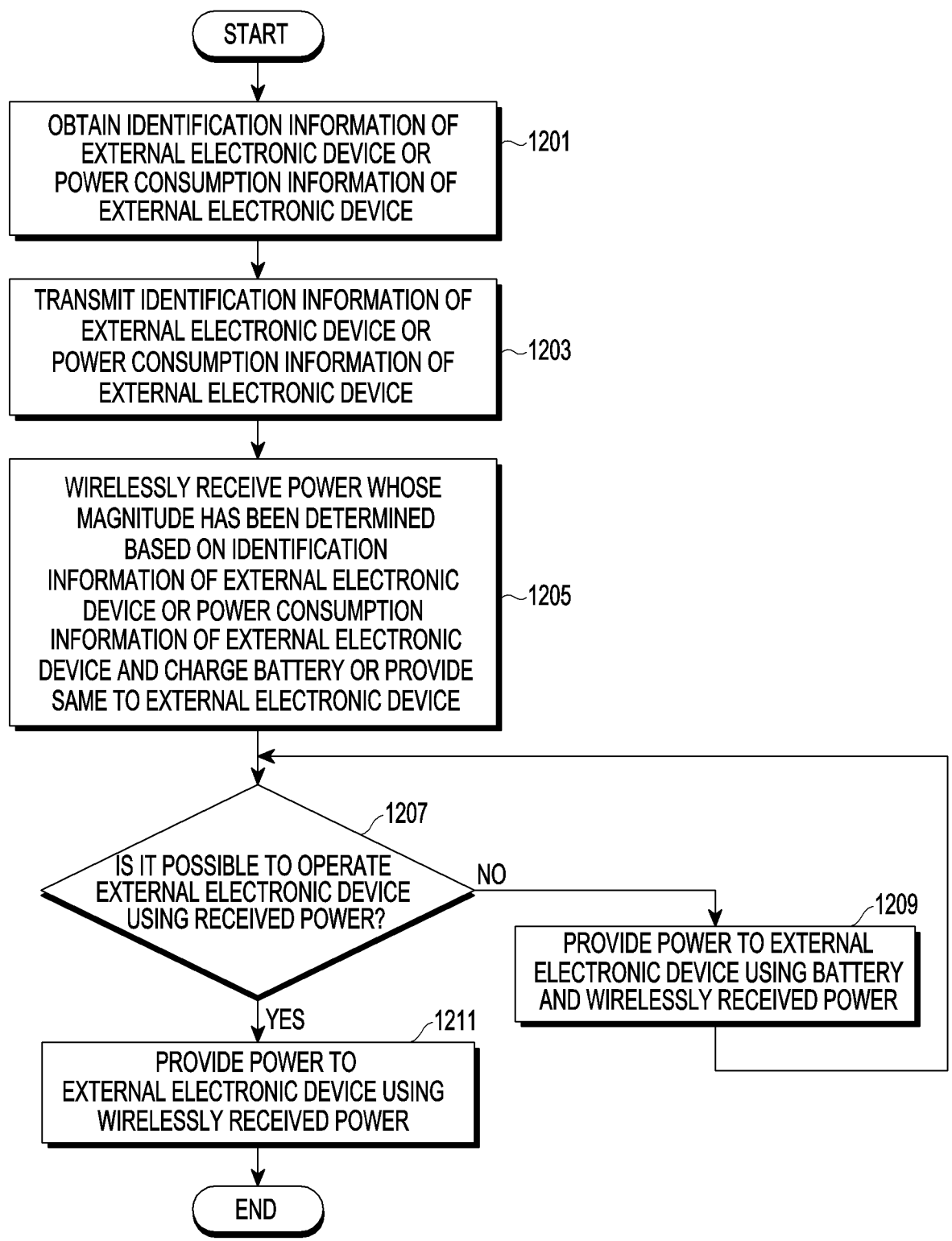
FIG. 12 is a flowchart illustrating an operation method of an electronic device according to an embodiment.

FIG. 12 is a flowchart illustrating an operation method of an electronic device according to an embodiment.

Referring to FIG. 12, in step 1201, the electronic device 150 obtains identification information of the external electronic device 190 or power consumption information of the external electronic device 190.

In step 1203, the electronic device 150 transmits the identification information of the external electronic device 190 or the power consumption information of the external electronic device 190 to the wireless power transmitting device 100.

In step 1205, the electronic device 150 wirelessly receives the power, the magnitude of which has been determined based on the identification information of the external electronic device 190 or the power consumption information of the external electronic device 190, and charges the battery, or provides the received power to the external electronic device 190. The electronic device 150 may simultaneously perform charging of the battery and provision to the external electronic device 190 using the wirelessly received power.

In step 1207, the electronic device 150 determines whether or not the external electronic device 190 can be operated by the received power, e.g., based on whether or not the magnitude of the received power is greater than the magnitude of the power required for the operation of the electronic device 150 and the magnitude of the rated power of the external electronic device 190. That is, the electronic device 150 may determine whether or not the magnitude of the received power is greater than a specified magnitude required for the operation of the external electronic device 190, thereby determining whether or not the external electronic device 190 can be operated by the received power. The electronic device 150 may determine whether or not the external electronic device 190 can be operated by the received power by further considering the efficiency of processing the wirelessly received power and the efficiency of the external electronic device 190. The electronic device 150 may determine whether or not the magnitude of the received power is greater than the magnitude of the power required for the operation of the electronic device 150 and the magnitude of the power consumption of the external device 190, thereby determining whether or not the external electronic device 190 can be operated by the received power.

If it is determined that the external electronic device 190 cannot be operated by the received power in step 1207, the electronic device 150 provides power to the external electronic device 190 using the battery and the wirelessly received power in step 1209. However, if it is determined that the external electronic device 190 can be operated by the received power in step 1207, the electronic device 150 provides power to the external electronic device using the wirelessly received power in step 1211.

The electronic device 150 may use some of the wirelessly received power to charge the battery. For example, when an obstacle enters the area between the electronic device 150 and the wireless power transmitting device 100, the magnitude of the power received by the electronic device 150 may be drastically reduced.

Alternatively, when a living body enters the area between the electronic device 150 and the wireless power transmitting device 100, the wireless power transmitting device 150 may reduce the magnitude of the transmission power, or may stop the wireless power transmission for the purpose of safety of the living body. In this case, there is a possibility that the external electronic device 190 receiving power from the electronic device 150 is turned off. If it is determined that the received power is insufficient for the operation of the external electronic device 190, the electronic device 150 may provide the power stored in the internal battery, thereby preventing the external electronic device 190 from being turned off.

The electronic device 150 may expect that the received power is insufficient for the operation of the external electronic device 190. In this case, the electronic device 150 may provide power to the external electronic device 190 in advance using the battery. The electronic device 150 may request the wireless power transmitting device 100 to increase the magnitude of the transmission power, and thus, if it is determined that the external electronic device 190 can be operated by the received power due to an increase in the magnitude of the reception power, the electronic device 150 may provide power to the external electronic device 190 using the wirelessly received power. The electronic device 150 may output information on the type of power provided to the external electronic device 190 through various output devices such as a display, an LED, etc.

Figure 13:
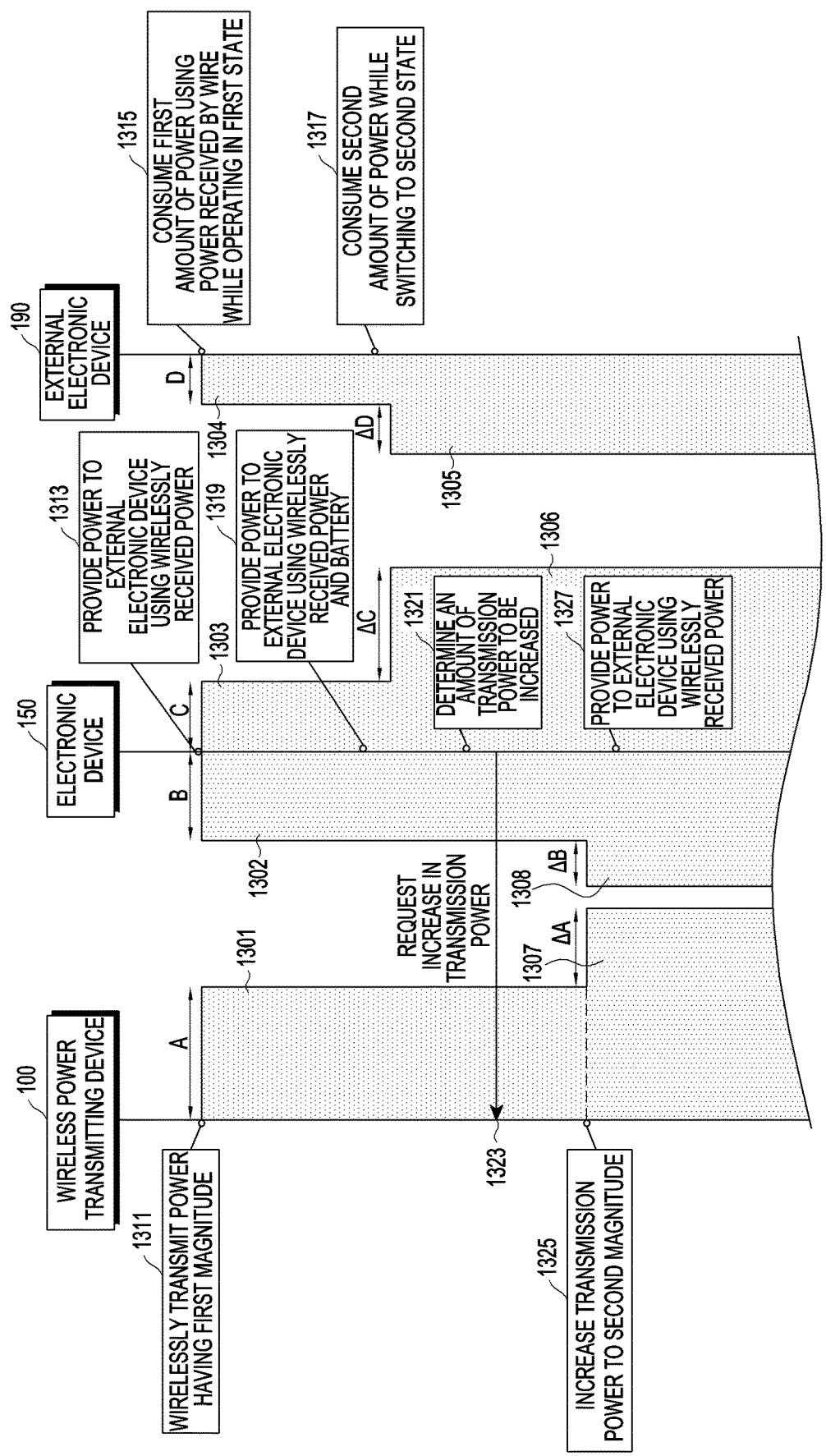
FIG. 13 is a signal flow diagram illustrating operation methods of an electronic device, a wireless power transmitting device, and an external electronic device according to an embodiment.

FIG. 13 is a signal flow diagram illustrating operations of an electronic device, a wireless power transmitting device, and an external electronic device according to an embodiment.

Referring to FIG. 13, in operation 1311, the wireless power transmitting device 100 wirelessly transmits power 1301 having a first magnitude (A).

In operation 1313, the electronic device 150 provides power 1303 to the external electronic device 190 using the wirelessly received power 1302. The magnitude (B) of the power 1302 received by the electronic device 150 may be smaller than the first magnitude (A), e.g., due to magnetic field attenuation. In addition, the magnitude (C) of the power 1303 provided to the external electronic device 190 may be smaller than the magnitude (B) because of the reception power processing efficiency of the electronic device 150 and the power consumption for the operation of the electronic device 150.

In operation 1315, the external electronic device 190 consumes the first amount of power 1304 while operating in the first state using the power received by a wire. The magnitude (D) of the first power consumption 1304 may be smaller than the magnitude (C) depending on the power transmission efficiency, the efficiencies of respective hardware components, etc.

In operation 1317, the external electronic device 190 consumes the second amount of power 1305 while switching to the second state. The magnitude (D+ΔD) of the second power consumption 1305 may be greater than the magnitude (D) of the first power consumption 1304.

In operation 1319, the electronic device 150 provides power 1306 to the external electronic device 190 using the wirelessly received power and the battery. The magnitude (C+ΔC) of the power 1306 may be greater than the magnitude (C), and for example, the increment (ΔC) may be provided from the battery of the electronic device 150 to the external electronic device 190.

In operation 1321, the electronic device 150 determines an amount of transmission power to be increased. For example, the electronic device 150 may determine an increment (ΔD) of the power consumption of the external electronic device 190, and thus, may determine an increment (ΔC) of the power of the electronic device 150.

In operation 1323, the electronic device 150 requests the wireless power transmitting device 100 to an increase the transmission power. For example, the electronic device 150 may transmit information on the increment (ΔC) of the provision power to the wireless power transmitting device 100.

In operation 1325, the wireless power transmitting device 100 increases the transmission power 1307 to a second magnitude (A+ΔA). The power 1308 received by the electronic device 150 may also be increased to the magnitude (B+ΔB), which is greater than the previous magnitude (B).

In operation 1327, the electronic device 150 provides power to the external electronic device 190 using the wirelessly received power. The electronic device 150 may use some of the received power 1308 for charging the battery.

As illustrated in FIG. 13, the external electronic device 190 may be stably supplied with power from the electronic device 150 even when the power consumption is increased.

In accordance with embodiment, a TV set may directly receive power from the wireless power transmitting device 100. In this case, the TV set may include a battery. When a sufficiently large amount of power is received from the wireless power transmitting device 100, the TV set may operate using the power received from the wireless power transmitting device 100. When the magnitude of the reception power is insufficient, the TV set may operate using both the received power and the power of the internal battery.

Figure 14:
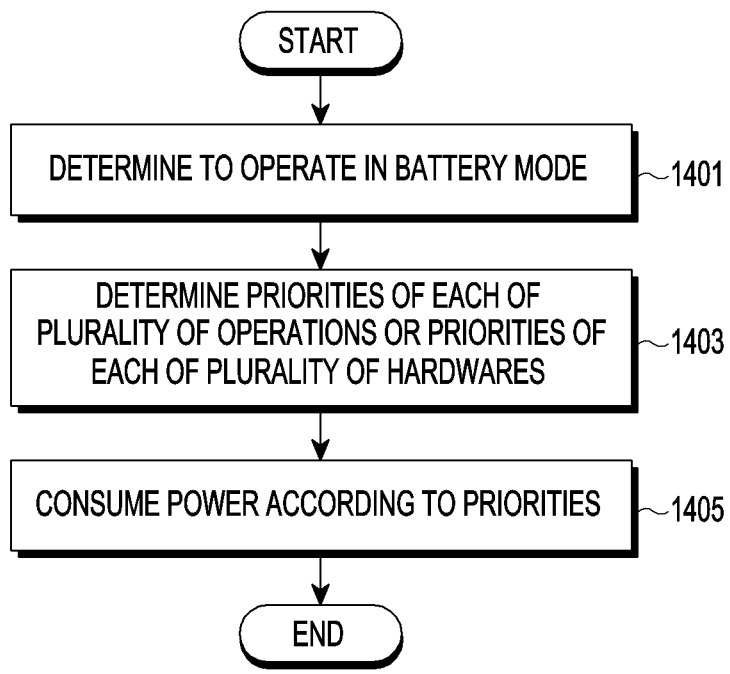
FIG. 14 is a flowchart illustrating an operation method of an electronic device according to an embodiment.

FIG. 14 is a flowchart illustrating an operation method of an electronic device according to an embodiment.

Referring to FIG. 14, in step 1401, the electronic device 150 determines to operate in a battery mode. For example, the electronic device 150 may determine that the magnitude of the reception power is insufficient for the operation of the external electronic device 150, and thus, the external electronic device 190 and the electronic device 150 may operate using the power stored in the battery.

In step 1403, the electronic device 150 determines priorities of each of a plurality of operations or priorities of each of a plurality of hardware, and in step 1405, the electronic device 150 consumes the power according to the priorities of each of the plurality of operations or the priorities of each of the plurality of hardware. The electronic device 150 also may consume the power according to both priorities of each of the plurality of operations and each of the plurality of hardware.

For example, the electronic device 150 may preset a priority of each application, and may terminate at least one application of a low priority among the running applications. The electronic device 150 may also preset the priorities for respective functions of a plurality of hardware components, and may limit at least some of the running hardware functions having a low priority.

The electronic device 150 may also control the operation of the external electronic device 190 according to the priority of at least one of the operation or hardware of the external electronic device 190. For example, the electronic device 150 may provide the external electronic device 190 with a signal to limit at least some of the functions of hardware components having a low priority among a plurality of hardware components of the external electronic device 190. The electronic device 150 may provide the external electronic device 190 with a signal to limit at least some of the hardware functions having a low priority among the applications of the external electronic device 190.

Figure 15:
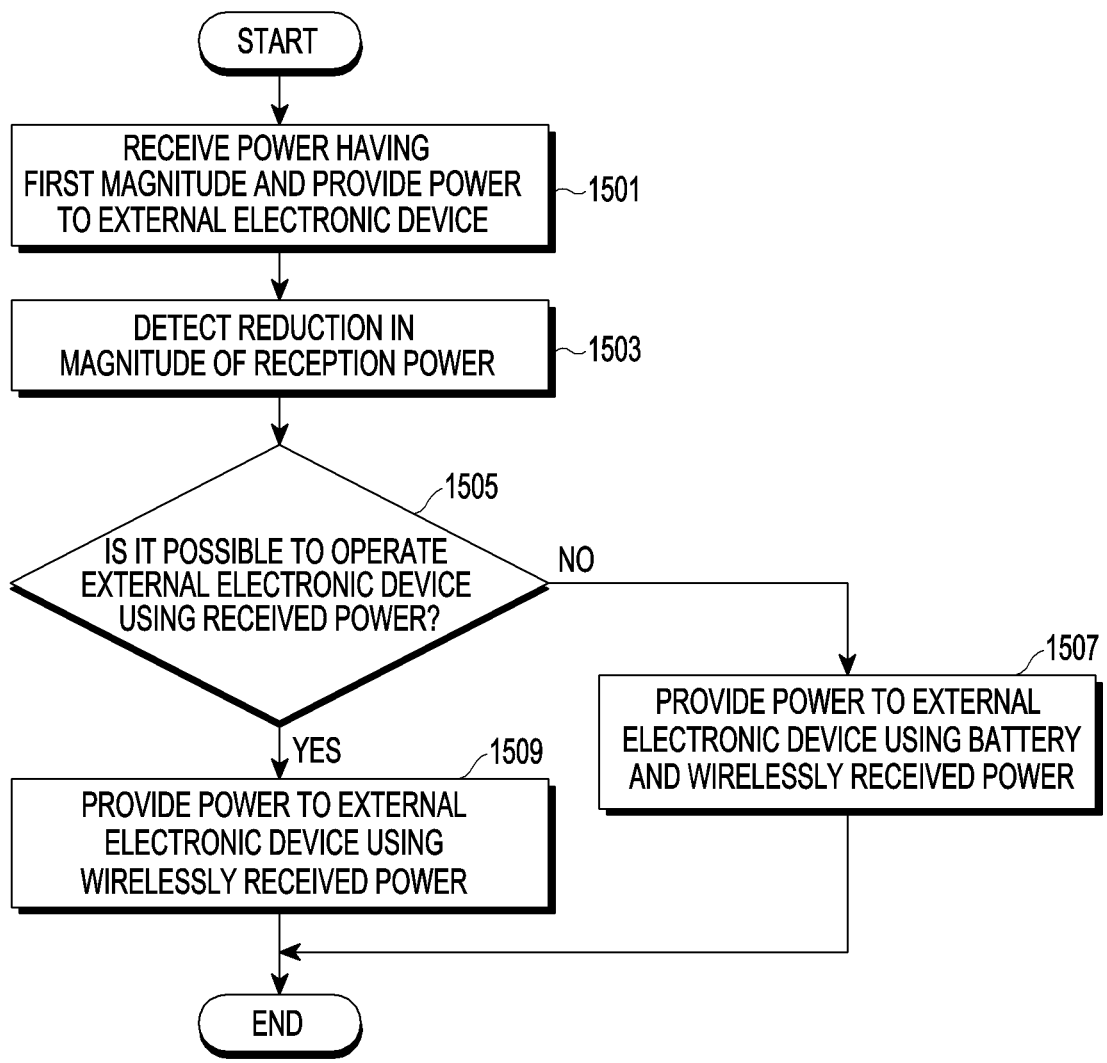
FIG. 15 is a flowchart illustrating an operation method of an electronic device according to an embodiment.

FIG. 15 is a flowchart illustrating an operation method of an electronic device according to an embodiment.

Referring to FIG. 15, in step 1501, the electronic device 150 receives power having a first magnitude in order to provide power to the external electronic device 190.

In step 1503, the electronic device 150 detects a reduction in the magnitude of the reception power. For example, the magnitude of the power received by the electronic device 150 may be reduced due to the displacement of the electronic device 150, the entry of an obstacle into the area between the electronic device 150 and the wireless power transmitting device 100, etc.

In step 1505, the electronic device 150 determines whether or not the external electronic device can be operated by the received power. The electronic device 150 may compare a threshold value with an index indicating the magnitude of the reception power (i.e., a voltage at an output terminal of a rectifier), and may determine whether or not the external electronic device 190 can be operated according to the comparison result. The threshold value may be set differently depending on the type of the external electronic device 190. In addition, the threshold value may be adaptively changed according to the power consumption of the external electronic device 190. For example, when the power consumption of the external electronic device 190 is relatively high, the threshold value may also be set relatively large.

If it is determined that the external electronic device cannot be operated by the received power in step 1505, the electronic device 150 provides power to the external electronic device 190 using the battery and the wirelessly received power in step 1507. However, if it is determined that the external electronic device can be operated by the received power in step 1505, the electronic device 150 provides power to the external electronic device 190 using the wirelessly received power in step 1509.

Figure 16:
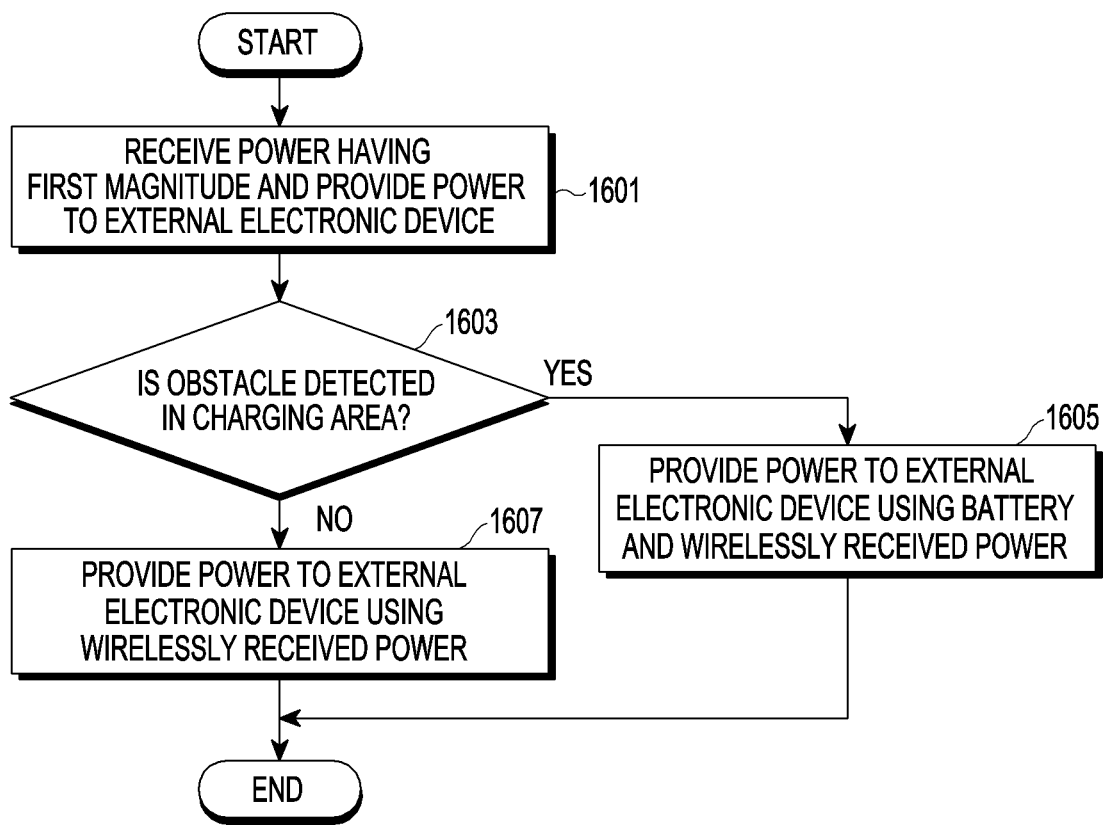
FIG. 16 is a flowchart illustrating an operation method of an electronic device according to an embodiment.

FIG. 16 is a flowchart illustrating an operation method of an electronic device according to an embodiment.

Referring to FIG. 16, in step 1601, the electronic device 150 receives power having a first magnitude in order to provide power to the external electronic device 190.

In step 1603, the electronic device 150 determines whether or not an obstacle is detected in a charging area.

Figure 17:
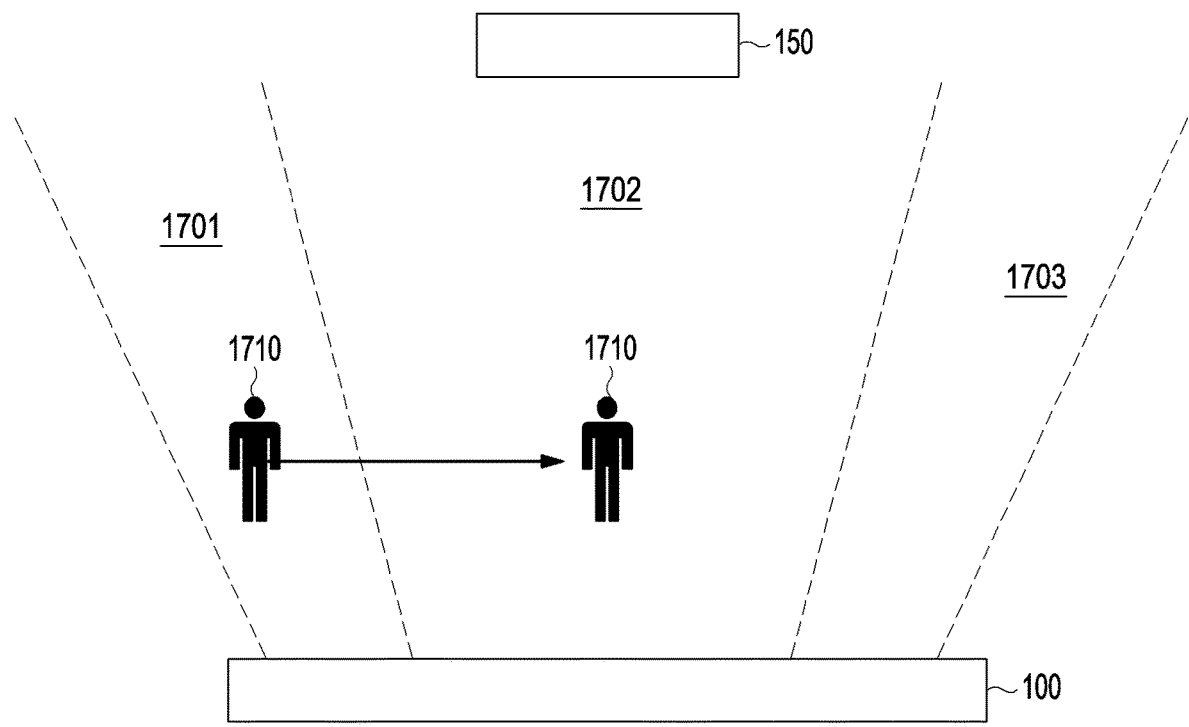
FIG. 17 illustrates an obstacle entering an area between a wireless power transmitting device and an electronic device according to an embodiment.

FIG. 17 illustrates an obstacle entering an area between a wireless power transmitting device and an electronic device according to an embodiment.

Referring to FIG. 17, the wireless power transmitting device 100 may wirelessly transmit power to a charging area 1702. The charging area 1702 may be determined by the disposed position or direction of a power transmitting circuit included in the wireless power transmitting device 100. The charging area 1702 may refer to an area where the magnitude of a magnetic field or electric field transmitted by the wireless power transmitting device 100 is greater than or equal to a threshold value. The separation lines between the charging area 1702 and the peripheral areas 1701 and 1703 may vary depending on the magnitude of the power transmitted by the wireless power transmitting device 100. For example, when the wireless power transmitting device 100 transmits a relatively large amount of power, the charging area 1702 may be relatively wide, and when the wireless power transmitting device 100 transmits a relatively small amount of power, the charging area 1702 may be relatively small.

The wireless power transmitting device 100 may monitor whether or not an obstacle appears in the peripheral areas 1701 and 1703 on the left and right sides of the charging area 1702 or in the charging area 1702. When an obstacle 1710 moves from the peripheral area 1701 to the charging area 1702, the magnitude of the power received by the electronic device 150 may be reduced.

Referring again to FIG. 16, upon detecting the entry of the obstacle 1710 into the charging area 1702 in step 1603, the electronic device 150 provides power to the external electronic device 190 using the battery and the wirelessly received power in step 1605. However, if no entry of the obstacle 1710 into the charging area 1702 is detected in step 1603, the electronic device 150 provides power to the external electronic device 190 using the wirelessly received power in step 1607.

When an obstacle is detected in the peripheral areas 1701 and 1703, the electronic device 150 may provide power to the external electronic device 190 using the power of the battery and the wirelessly received power, and when an obstacle enters the charging area 1702, the electronic device 150 may provide power to the external electronic device 190 using only the power of the battery.

Alternatively, when the obstacle 1710 is located in the peripheral areas 1701 and 1703, the electronic device 150 may provide the external electronic device 190 with power at a first ratio of the battery power to the reception power, and when the obstacle 1710 is located in the charging area 1702, the electronic device 150 may provide the external electronic device 190 with power at a second ratio of the battery power to the reception power.

Figure 18:
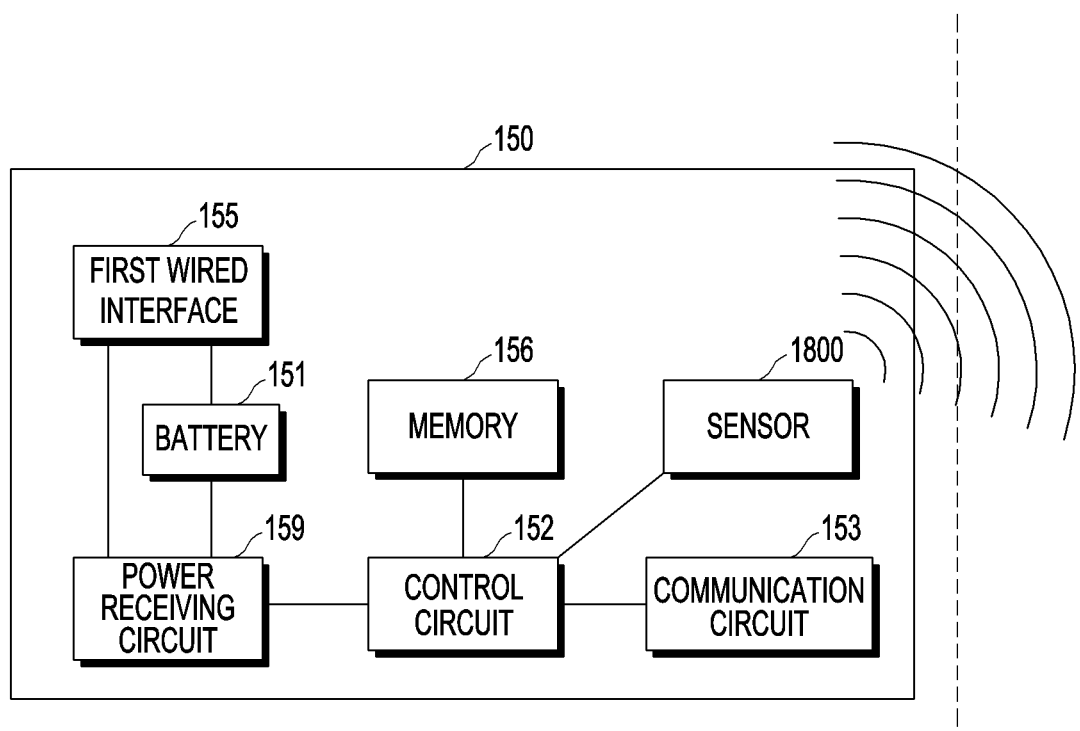
FIG. 18 illustrates an electronic device according to an embodiment.

FIG. 18 illustrates an electronic device according to an embodiment.

Referring to FIG. 18, compared to FIG. 3A, the electronic device 150 further includes a sensor 1800 that may sense data on the charging area 1702 or the peripheral areas 1701 and 1703. The control circuit 152 may determine whether or not an obstacle appears in the charging area 1702 or the peripheral areas 1701 and 1703 using the sensed data. The sensor 1800 may be any device that can sense data for detecting the appearance of an obstacle, and may be implemented in various forms such as a communication circuit, a camera, a proximity sensor, an ultrasonic sensor, etc.

Figure 19:
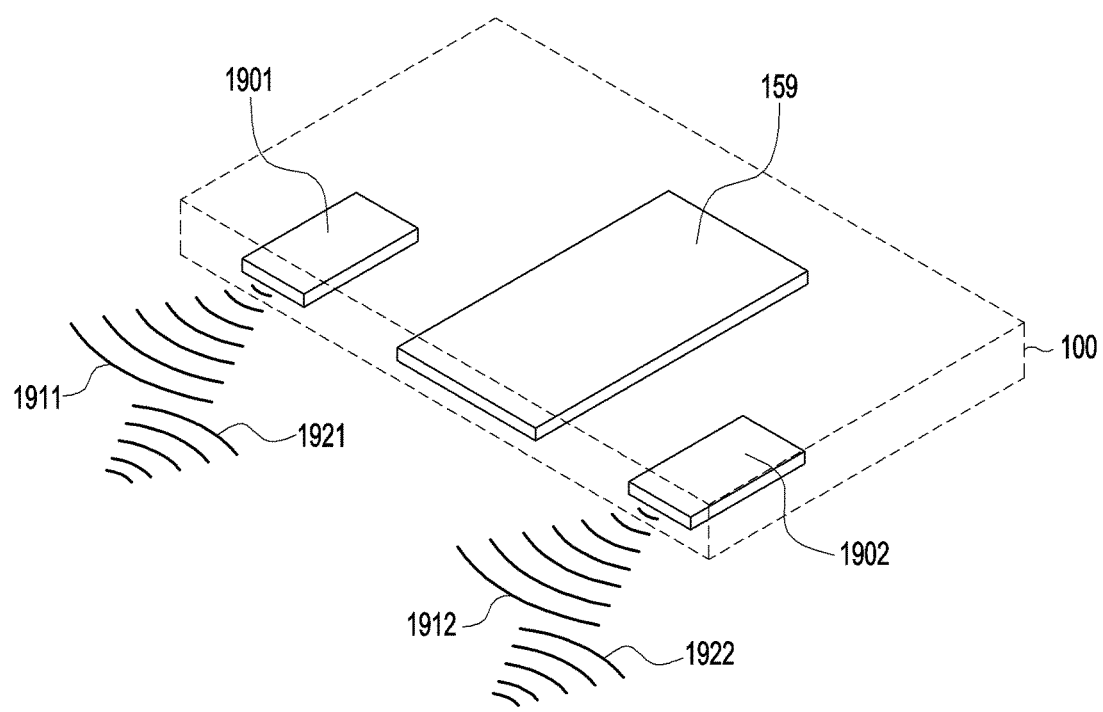
FIG. 19 illustrates an electronic device according to an embodiment.

FIG. 19 illustrates an electronic device according to an embodiment.

Referring to FIG. 19, the electronic device 150 includes a power receiving circuit 159 and sensors 1901 and 1902. The sensors 1901 and 1902 may be implemented as communication circuits, and may transmit communication signals 1911 and 1912, respectively. The sensors 1901 and 1902 may be positioned on the right and left sides of the power transmitting circuit 109, respectively, and may be disposed at positions suitable for transmission of the communication signals 1911 and 1912 to the peripheral areas on the left and right sides of the charging area. The communication signals 1911 and 1912 may be reflected by surrounding structures. The reflection waves 1921 and 1922 may proceed to the respective sensors 1901 and 1902, and the sensors 1901 and 1902 may measure at least one of the amplitude, phase, and flight time of the reflection wave 1921 or 1922. At least one of the amplitude or phase of the reflection wave 1921 or 1922 may vary in comparison with the transmitted communication signal 1911 or 1912. The electronic device 150 may store reference information as shown in Table 6.

TABLE 6

| Sensor number | Amplitude attenuation (dB) | Phase variation (rad) | Time of flight (µs) |
|---|---|---|---|
| 501 | −2 | +13 | 0.12 |
| 502 | −4.1 | −3 | 0.28 |

Alternatively, the electronic device 150 may store at least one of the amplitude or phase of the received reflection wave. The electronic device 150 may periodically or non-periodically receive the reflection waves 1921 and 1922 in order to measure the characteristics thereof. The electronic device 150 may refer to the reference information, and may detect the appearance of an obstacle in the surrounding area. For example, reference information for the sensor 1902, as shown in Table 6, may have amplitude attenuation of −4.1 dB, a phase variation of −3 rad, and a flight time of 0.28 µs. The electronic device 150 may determine that a reflection signal at a second time has signal attenuation of −1.2 dB, a phase variation of 40 rad, and a flight time of 0.12 µs, compared to the communication signal. That is, the electronic device 150 may confirm that the difference of 2.9 dB in the signal attenuation, the difference of 43 rad in the phase variation, and the difference of 0.16 µs in the flight time have been detected. If it is determined that the difference between the reference information and the characteristic of the reflection signal exceeds a threshold value, the electronic device 150 may determine that an obstacle has appeared in a peripheral area corresponding to the sensor.

The electronic device 150 may compare the difference of each of the signal attenuation, phase variation, and flight time with a threshold value set for each factor, or may compare the same with a threshold value set to correspond thereto using the sum of weights. Alternatively, the electronic device 150 may detect the appearance of an obstacle according to a change in at least one of the amplitude or phase of the reflection wave.

The sensors 1901 and 1902 may be implemented as a communication circuits for communication with the wireless power transmitting device 100, or may be implemented as a communication circuits for communication with another device other than the wireless power transmitting device 100. Alternatively, an external sensor, which is implemented as a communication circuit separately from the electronic device 150, may measure the reflection wave, thereby detecting the appearance of an obstacle.

When the appearance of an obstacle is detected, the external sensor may transmit information on the appearance of the obstacle to the electronic device 150.

The electronic device 150 may photograph an image of an outer scene, and may detect the appearance of an obstacle through image analysis. When an obstacle is detected in the charging area or the peripheral areas, e.g., using the various methods described above, the electronic device 150 may also provide power to the external electronic device 190 using the power stored in the battery.

Figure 20A:
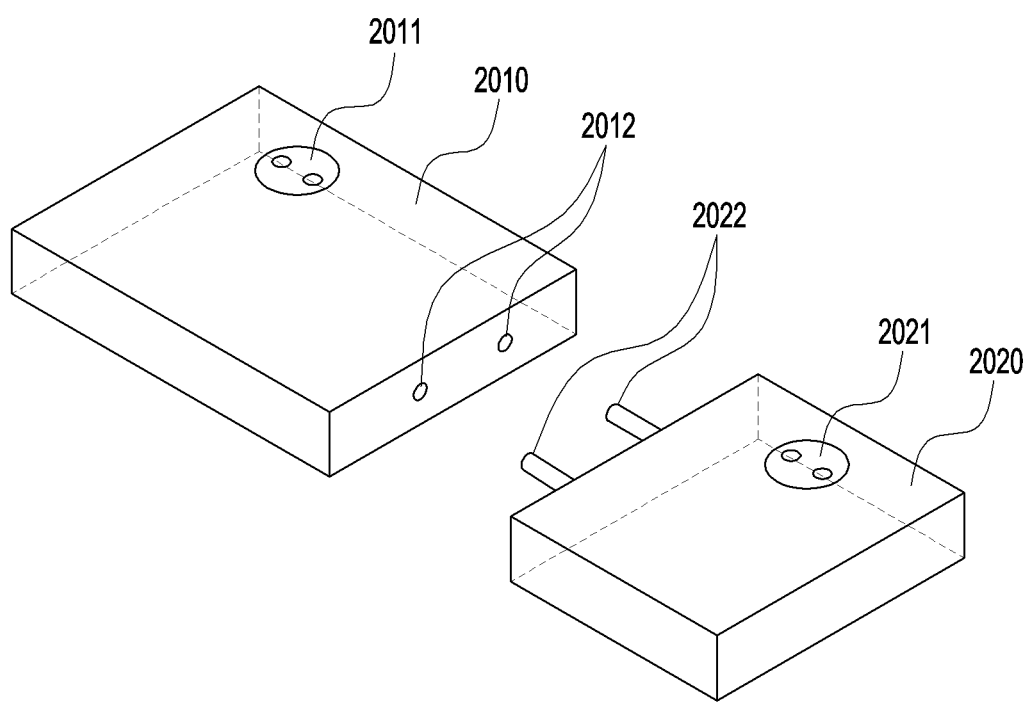
FIGS. 20A and 20B illustrate an electronic device for wireless power reception according to an embodiment.
Figure 20B:
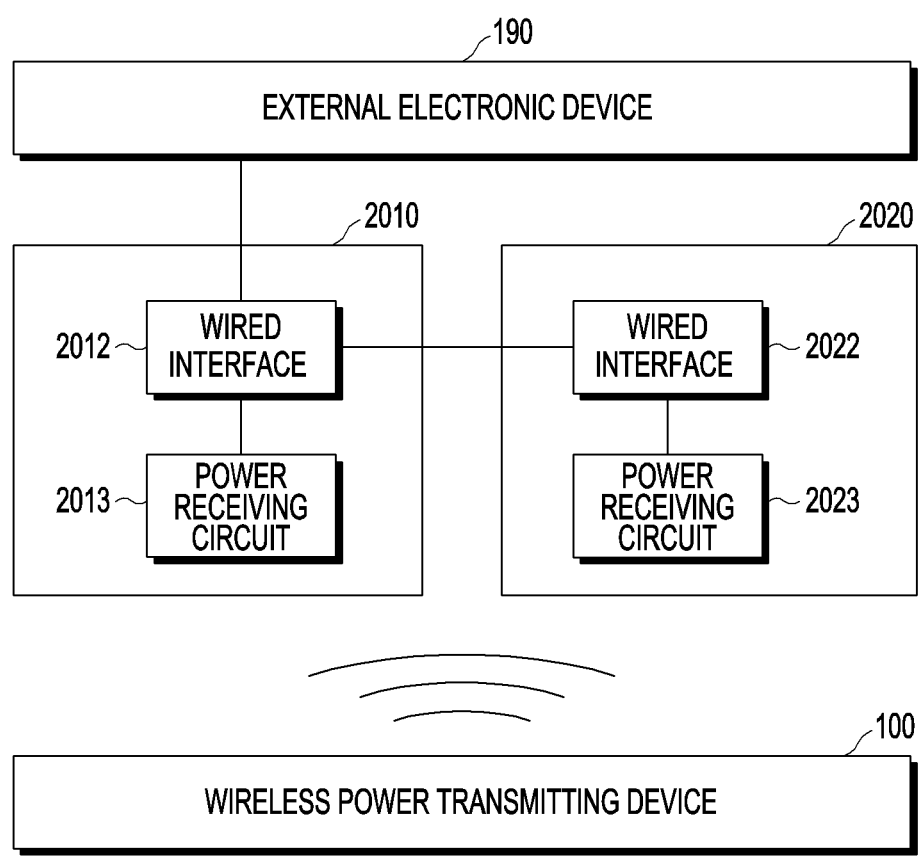

FIGS. 20A and 20B illustrate an electronic device for wireless power reception according to an embodiment.

Referring to FIGS. 20A and 20B, a first electronic device 2010 may be attached to a second electronic device 2020, and the first electronic device 2010 may be connected to the second electronic device 2020 through a wired interface 2012. The wired interface 2012 of the first electronic device 2010 may have a socket for receiving a plug, which is the wired interface 2022 of the second electronic device 2020. The first electronic device 2010 may transmit the received power to the external electronic device 190 through another wired interface 2011. The power received by the power receiving circuit 2023 of the second electronic device 2020 may be transmitted to the external electronic device 190 through the wired interface 2022 and the wired interface 2012. Accordingly, the first electronic device 2010 and the second electronic device 2020 may transmit the received power to the external electronic device 190 through a plurality of power receiving circuits 2013 and 2023. For example, when the wireless power transmitting device 100 forms a magnetic field over a relatively wide charging area, the power receiving circuits 2013 and 2023 should be disposed to cover a relatively wide range in order to increase the power transmission/reception efficiency. Accordingly, a plurality of electronic devices 2010 and 2020 may be connected to a single external electronic device 190 for power reception. For example, for a large-capacity external electronic device 190, a plurality of electronic devices 2010 and 2020 for power reception may be connected to the external electronic device 190, thereby providing a relatively large amount of power to the external electronic device 190.

Figure 21:
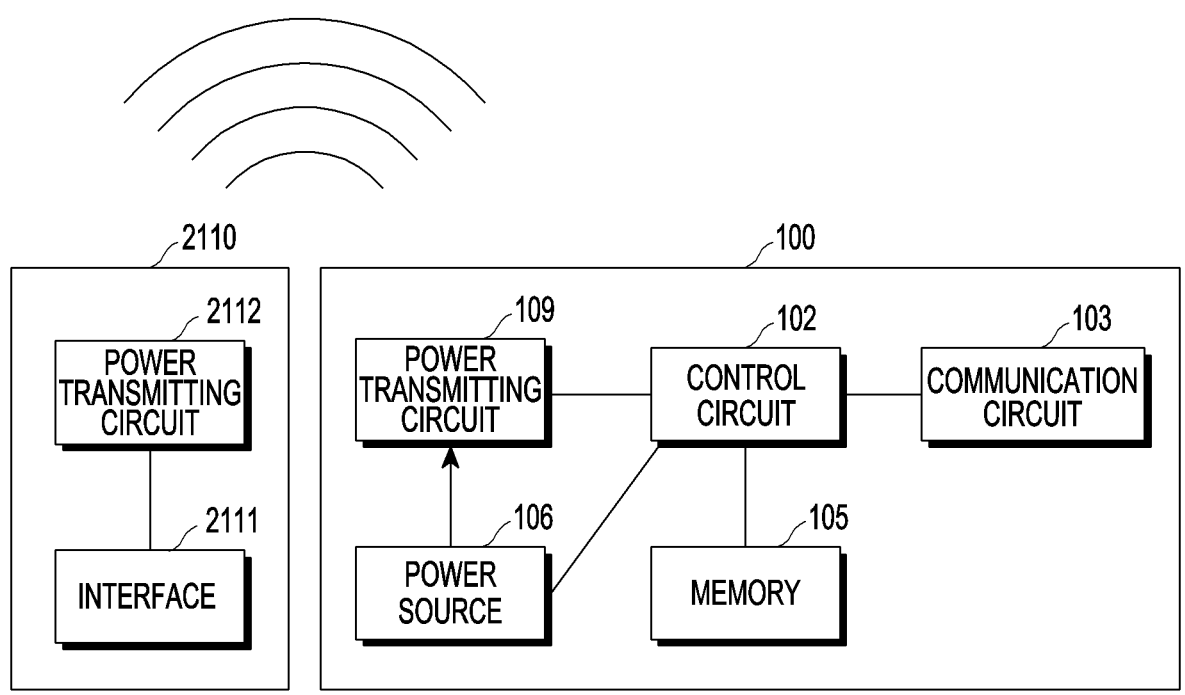
FIG. 21 illustrates a wireless power transmitting device according to an embodiment.

FIG. 21 illustrates a wireless power transmitting device according to an embodiment. Like the electronic devices illustrated in FIGS. 20A and 20B, the wireless power transmitting devices of FIG. 21 may also be connected to each another. For example, a power source 106 of the wireless power transmitting device 100 may be connected to an interface 2111 of the wireless power transmitting device 2110.

Power may be transmitted to the power transmitting circuit 2112 through the interface 2111. Those skilled in the art will readily understand that the interface 2111 is not limited to a specific form as long as it may receive power from another wireless power transmitting device. The power transmitting circuit 109 and the power transmitting circuit 2112 may wirelessly transmit power. A plurality of power transmitting circuits 109 and 2112 may transmit power so that the power can be transmitted over a relatively wide range. For example, when a plurality of electronic devices for wirelessly receiving power are disposed or when the coil in the power receiving circuit has a relatively large size, the wireless power transmitting device 2110 may be connected to the existing wireless power transmitting device 100, thereby transmitting power over a relatively wider range.

The respective elements of the wireless power transmitting device or the electronic device, which have been described above, may be include one or more components, and the names of the components may vary depending on the type of the electronic device. In accordance with the above-described embodiments, an electronic device may be configured to include at least one of the above-described elements, and the electronic device may exclude some elements or add other elements thereto. In addition, some of the elements of the electronic device, according to various embodiments, may be combined to configure a single entity that performs the same functions of the elements as those of the original elements before the combination.

As used herein, the term "module" may refer to a unit including hardware, software, firmware, or a combination thereof. The term "module" may be interchangeably used with terms such as, a unit, logic, a logical block, an element, and a circuit. A "module" may be a minimum unit of an integrally configured element or a part thereof. A "module" may be a minimum unit for performing one or more functions or a part thereof. A "module" may be implemented mechanically or electronically. For example, a "module" may include at least one of an application-specific integrated circuit (ASIC) chip, field-programmable gate arrays (FPGAs), and a programmable-logic device, which are known or will be developed in the future.

At least some of the devices (e.g., modules or functions thereof) or methods (e.g., operations), according to the above-described embodiments, may be implemented by instructions stored in a computer-readable storage media, e.g., in the form of a program module. The instructions, when executed by a processor, may instruct one or more processors to perform functions corresponding to the instructions. The computer-readable storage medium may be a memory.

According to an embodiment, a storage medium may store instructions that, when executed by at least one processor, instruct at least one processor to perform one or more operations of wirelessly receiving power from a wireless power transmitting device; and providing the received power to an external electronic device through a wired power interface of the electronic device.

The one or more operations may include wirelessly receiving power; and if it is determined that the magnitude of the received power is greater than a predetermined magnitude, performing control such that the electronic device operates using the received power, or if it is determined that the magnitude of the received power is equal to or less than the predetermined magnitude, performing control such that the electronic device operates using the received power and the power stored in a battery of the electronic device.

The one or more operations may include, when connected to a first external electronic device through a wired power interface, performing control so as to receive first power having a first magnitude from a wireless power transmitting device; providing the received first power to the first external electronic device through the wired power interface; when disconnected from the first external electronic device and connected to a second external electronic device through the wired power interface, performing control so as to receive, from the wireless power transmitting device, second power having a second magnitude different from the first magnitude; and providing the received second power to the second external device through the wired power interface.

The above-described commands may be stored in an external server, and may be downloaded and installed in an electronic device such as a wireless power transmitter. That is, an external server may store instructions that the wireless power transmitter can download.

The computer readable recoding medium may include a hard disk, a floppy disk, magnetic media (e.g., a magnetic tape), optical media (e.g., a compact disc read only memory (CD-ROM) and a DVD), magneto-optical media (e.g., a floptical disk), a hardware device (e.g., a read only memory (ROM), a random access memory (RAM), a flash memory), etc. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments may be executed sequentially, in parallel, repeatedly, or in a heuristic manner. Further, some operations may be executed in a different order or may be omitted, or other operations may be added.

Various embodiments disclosed herein are provided merely to easily describe technical details of the present disclosure and to help the understanding of the present disclosure, and are not intended to limit the scope of the present disclosure. Therefore, it should be construed that all modifications and changes or modified and changed forms based on the technical idea of the present disclosure fall within the scope of the present disclosure.

What is claimed is:

1. An electronic device, comprising:
   a communication circuit;
   a wired power interface;
   a power receiving circuit; and
   a control circuit configured to:
      identify a connection between the electronic device and an external electronic device;
      based on identifying the connection between the electronic device and the external electronic device, identify a magnitude of power required for at least one operation of the external electronic device;
      control the communication circuit to transmit information on the magnitude of the required power;
      based on transmitting the information on the magnitude of the required power, control the power receiving circuit to wirelessly receive power for charging the external electronic device corresponding to the magnitude of the required power from a wireless power transmitting device; and
      provide at least a part of the received power to the external electronic device through the wired power interface.

2. The electronic device of claim 1, wherein the control circuit is configured to:
  obtain identification information of the external electronic device or power consumption information of the external electronic device; and
  based on the identification information of the external electronic device or the power consumption information of the external electronic device, determine at least one of a magnitude of a reception power received from the wireless power transmitting device or a magnitude of a transmission power transmitted by the wireless power transmitting device.

3. The electronic device of claim 2, wherein the control circuit is configured to:
  receive, through the communication circuit, a communication signal including the identification information of the external electronic device from the external electronic device; and
  obtain the identification information of the external electronic device included in the received communication signal.

4. The electronic device of claim 2, further comprising a sensor configured to measure at least one of a magnitude of a voltage applied to the wired power interface or a magnitude of a current flowing to the external electronic device through the wired power interface,
  wherein the control circuit is further configured to:
    apply test power to the wired power interface; and
    determine the power consumption information of the external electronic device using at least one of the magnitude of the voltage applied to the wired power interface or the magnitude of the current flowing to the external electronic device through the wired power interface, which is measured by the sensor, while applying the test power.

5. The electronic device of claim 2,
  wherein the control circuit is further configured to control the communication circuit to transmit, to the wireless power transmitting device, a communication signal including at least one of information on a magnitude of reception power received from the wireless power transmitting device or information on a magnitude of transmission power transmitted by the wireless power transmitting device.

6. The electronic device of claim 2, wherein the power receiving circuit comprises:
  a coil configured to wirelessly receive the power for charging the external electronic device;
  a rectifying circuit configured to rectify the received power; and
  a converting circuit configured to adjust a magnitude of a voltage of the rectified power.

7. The electronic device of claim 6, wherein the control circuit is further configured to, based on the identification information of the external electronic device or the power consumption information of the external electronic device, control to adjust the magnitude of the voltage of the power rectified by the converting circuit.

8. The electronic device of claim 1, further comprising:
  a sensor configured to measure at least one of a magnitude of a voltage or a magnitude of a current of the received power; and
  an output device,
  wherein the control circuit is further configured to:
    control the output device to output a first type of indication, if at least one of the magnitude of the voltage and the magnitude of the current of the power satisfies a predetermined first condition; and
    control the output device to output a second type of indication, if at least one of the magnitude of the voltage and the magnitude of the current of the power satisfies a predetermined second condition.

9. The electronic device of claim 1, further comprising:
  another wired interface,
  wherein the control circuit is further configured to:
    control the communication circuit to receive a communication signal including media data; and
    provide the media data to the external electronic device through the other wired interface.

10. The electronic device of claim 1, wherein the wired power interface comprises a socket corresponding to a plug.

11. The electronic device of claim 1, further comprising a fastener configured to fasten the electronic device to the external electronic device.

12. The electronic device of claim 1, further comprising a battery, wherein the control circuit is further configured to:
  provide at least the part of the received power to the external electronic device through the wired power interface, based on determining that the magnitude of the received power is greater than a predetermined magnitude; and
  provide at least the part of the received power and power stored in the battery to the external electronic device through the wired power interface, based on determining that the magnitude of the received power is less than or equal to the predetermined magnitude.

13. The electronic device of claim 12, wherein the control circuit is further configured to limit at least one of a function of the electronic device, an application of the electronic device, a function of the external electronic device, or an application of the external electronic device according to priority, based on determining that the magnitude of the received power is less than or equal to the predetermined magnitude.

14. The electronic device of claim 12,
  wherein the control circuit is further configured to:
    control the communication circuit to transmit a communication signal requesting an increase in transmission power to the wireless power transmitting device, based on determining that the magnitude of the received power is less than or equal to the predetermined magnitude; and
    stop the providing of the power stored in the battery, based on determining that the magnitude of the received power is greater than the predetermined magnitude.

15. The electronic device of claim 12, wherein the control circuit is further configured to charge the battery using the received power, based on determining that the magnitude of the received power is greater than the predetermined magnitude.

16. The electronic device of claim 1, further comprising:
  a sensor; and
  a battery,
  wherein the control circuit is further configured to:
    provide at least the part of the received power and power stored in the battery to the external electronic device through the wired power interface, based on determining that an obstacle is detected in a first area around the electronic device using data received from the sensor;
    provide the power stored in the battery to the external electronic device through the wired power interface, based on determining that an obstacle is detected in a second area around the electronic device using data received from the sensor; and provide at least the part of the received power to the external electronic device through the wired power interface, based on determining that no obstacle is detected using data received from the sensor.

17. A method of operation of an electronic device, the method comprising:
identifying a connection between the electronic device and an external electronic device;
based on identifying the connection between the electronic device and the external electronic device, identifying a magnitude of power required for at least one operation of the external electronic device;
transmitting information on the magnitude of the required power;
based on transmitting the information on the magnitude of the required power, wirelessly receiving power for charging the external electronic device corresponding to the magnitude of the required power from a wireless power transmitting device; and
providing at least a part of the received power to the external electronic device through a wired power interface of the electronic device.

18. The method of claim 17, further comprising:
obtaining identification information of the external electronic device or power consumption information of the external electronic device; and
based on the identification information of the external electronic device or the power consumption information of the external electronic device, determining at least one of a magnitude of reception power received from a wireless power transmitting device or a magnitude of transmission power transmitted by the wireless power transmitting device.

19. The method of claim 18, wherein the obtaining of the identification information of the external electronic device comprises:
receiving a communication signal including the identification information of the external electronic device from the external electronic device; and
obtaining the identification information of the external electronic device included in the received communication signal.

20. The method of claim 18, wherein the obtaining of the power consumption information of the external electronic device comprises:
applying test power to the wired power interface; and
determining the power consumption information of the external electronic device using at least one of a magnitude of a voltage applied to the wired power interface or a magnitude of a current flowing to the external electronic device through the wired power interface, while applying the test power.

21. The method of claim 18, further comprising:
transmitting, to the wireless power transmitting device, a communication signal including at least one of information on a magnitude of reception power received from the wireless power transmitting device or information on a magnitude of transmission power transmitted by the wireless power transmitting device.

22. The method of claim 18, further comprising:
based on the identification information of the external electronic device or the power consumption information of the external electronic device, adjusting a magnitude of a voltage of power of the received power rectified by a converting circuit of the electronic device.

23. The method of claim 17, further comprising:
outputting a first type of indication, if a magnitude of the received power satisfies a predetermined first condition; and
outputting a second type of indication, if the magnitude of the received power satisfies a predetermined second condition.

24. The method of claim 17, further comprising:
receiving a communication signal including media data; and
providing the media data to the external electronic device through another wired interface of the electronic device.

25. The method of claim 17, wherein the providing of at least the part of the received power to the external electronic device through the wired power interface of the electronic device comprises:
providing at least the part of the received power to the external electronic device through the wired power interface, based on determining that a magnitude of the received power is greater than a predetermined magnitude; and
providing at least the part of the received power and power stored in a battery of the electronic device to the external electronic device through the wired power interface, based on determining that the magnitude of the received power is less than or equal to the predetermined magnitude.

26. The method of claim 25, further comprising:
limiting at least one of a function of the electronic device, an application of the electronic device, a function of the external electronic device, or an application of the external electronic device, based on determining that the magnitude of the received power is less than or equal to the predetermined magnitude.

27. The method of claim 25, further comprising:
transmitting a communication signal requesting an increase in transmission power to the wireless power transmitting device, based on determining that the magnitude of the received power is less than or equal to the predetermined magnitude; and
stopping the providing of the power stored in the battery, based on determining that the magnitude of the received power is greater than the predetermined magnitude.

28. The method of claim 25, further comprising:
charging the battery using the received power, based on determining that the magnitude of the received power is greater than the predetermined magnitude.

29. The method of claim 17, wherein the providing of at least the part of the received power to the external electronic device through the wired power interface of the electronic device comprises:
providing at least the part of the received power and power stored in a battery to the external electronic device through the wired power interface, based on determining that an obstacle is detected in a first area around the electronic device;
providing the power stored in the battery to the external electronic device through the wired power interface, based on determining that an obstacle is detected in a second area around the electronic device; and providing at least the part of the received power to the external electronic device through the wired power interface, based on determining that no obstacle is detected.

30. An electronic device, comprising:
a power receiving circuit;
a battery;
a wired power interface; and
a control circuit configured to:
  control the power receiving circuit to wirelessly receive power for charging an external electronic device from a wireless power transmitting device;
  based on receiving the power for charging the external electronic device, identify a magnitude of the received power;
  based on identifying that the magnitude of the received power is greater than a predetermined magnitude, provide first power to the external electronic device through the wired power interface using the received power; and
  based on identifying that the magnitude of the received power is less than or equal to the predetermined magnitude, provide second power to the external electronic device through the wired power interface using the received power and power stored in the battery.

31. A method of operation of an electronic device, the method comprising:
  wirelessly receiving power for charging an external electronic device from a wireless power transmitting device;
  based on receiving the power for charging the external electronic device, identifying a magnitude of the received power;
  based on identifying that the magnitude of the received power is greater than a predetermined magnitude, providing first power to the external electronic device through the wired power interface using the received power; and
  based on identifying that the magnitude of the received power is less than or equal to the predetermined magnitude, providing second power to the external electronic device through the wired power interface using the received power and a power stored in a battery of the electronic device.

32. An electronic device, comprising:
a wired power interface;
a power receiving circuit; and
a control circuit configured to:
  identify a type of an external electronic device connected to the electronic device through the wired power interface;
  based on identifying that the type of the external electronic device is a first type, control the power receiving circuit to wirelessly receive first power having a first magnitude corresponding to the first type for charging the external electronic device from a wireless power transmitting device and provide at least a part of the received first power to the external electronic device through the wired power interface; and
  based on identifying that the type of the external electronic device is a second type, control the power receiving circuit to wirelessly receive second power having a second magnitude corresponding to the second type different from the first magnitude for charging the external electronic device from the wireless power transmitting device and provide at least a part of the received second power to the external electronic device through the wired power interface.

33. A method of operation of an electronic device, the method comprising:
  identifying a type of an external electronic device connected to the electronic device through a wired power interface of the electronic device;
  based on identifying that the type of the external electronic device is a first type, wirelessly receiving first power having a first magnitude corresponding to the first type for charging the external electronic device from a wireless power transmitting device and providing at least a part of the received first power to the external electronic device through the wired power interface;
  based on identifying that the type of the external electronic device is a second type, wirelessly receiving second power having a second magnitude different corresponding to the second type from the first magnitude for charging the external electronic device from the wireless power transmitting device; and
  providing at least a part of the received second power to the external electronic device through the wired power interface.

* * * * *